US012771025B2

(12) United States Patent
Cui et al.

(10) Patent No.: US 12,771,025 B2
(45) Date of Patent: Oct. 20, 2026

(54) PHASED ARRAY AND ELECTRONIC DEVICE

(71) Applicant: Huawei Technologies Co., Ltd., Shenzhen (CN)

(72) Inventors: Keji Cui, Shenzhen (CN); Di Li, Shenzhen (CN); Peng Gao, Shanghai (CN); Yongchang Yu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 545 days.

(21) Appl. No.: 18/345,373

(22) Filed: Jun. 30, 2023

(65) Prior Publication Data

US 2023/0344125 A1 Oct. 26, 2023

Related U.S. Application Data

(63) Continuation of application No. PCT/CN2021/137460, filed on Dec. 13, 2021.

(30) Foreign Application Priority Data

Dec. 31, 2020 (WO) ................ PCT/CN2020/142084

(51) Int. Cl.

*H01Q 3/36* (2006.01)
*H03K 5/00* (2006.01)
*H04B 7/06* (2006.01)

(52) U.S. Cl.

CPC ........... *H01Q 3/36* (2013.01); *H03K 5/00006* (2013.01); *H04B 7/0617* (2013.01); *H03K 2005/00286* (2013.01)

(58) Field of Classification Search

CPC ................. H01Q 3/36; H03K 5/00006; H03K 2005/00286; H04B 7/0617

See application file for complete search history.

(56) References Cited

U.S. PATENT DOCUMENTS

2019/0305438 A1* 10/2019 Ling ........................ H01Q 3/26

FOREIGN PATENT DOCUMENTS

CN 101527577 A 9/2009
CN 101547177 A * 9/2009
CN 111464192 A * 7/2020 .............. H04B 1/40
WO 2020197691 A1 10/2020

* cited by examiner

*Primary Examiner* — Resha Desai
*Assistant Examiner* — Peter Davon Doze
(74) *Attorney, Agent, or Firm* — Conley Rose, P.C.

(57) ABSTRACT

A phased array includes a local oscillator signal adjustment path, a first adder, a first power divider, and a plurality of radio-frequency signal transmit channels. An output end of the local oscillator signal adjustment path is coupled to a first input end of the first adder, and is configured to input a first signal to the first adder. A second input end of the first adder is coupled to a transmit path, and is configured to receive a second signal, and the first adder superimposes the first signal on the second signal to generate a to-be-transmitted signal. An input end of the first power divider is coupled to an output end of the first adder, an output end of the first power divider is coupled to input ends of the plurality of radio-frequency signal transmit channels.

20 Claims, 21 Drawing Sheets

PHASED ARRAY AND ELECTRONIC DEVICE

CROSS-REFERENCE TO RELATED APPLICATIONS

This is a continuation of International Patent Application No. PCT/CN2021/137460 filed on Dec. 13, 2021, which claims priority to International Patent Application No. PCT/CN2020/142084 filed on Dec. 31, 2020. The disclosures of the aforementioned applications are hereby incorporated by reference in their entireties.

TECHNICAL FIELD

Embodiments of this disclosure relate to the field of wireless communication, and in particular, to a phased array and an electronic device.

BACKGROUND

With the development of science and technology, communication technologies have been improved by leaps and bounds. In other communication technologies, a local oscillator signal is usually used at a radio frequency front-end to perform up-conversion processing on an intermediate-frequency signal to generate a radio-frequency signal. Using the local oscillator signal to perform up-conversion processing on the intermediate-frequency signal causes local oscillator leakage, affecting quality of communication signals.

SUMMARY

Embodiments of this disclosure provide a phased array, to improve quality of communication signals.

To achieve the foregoing objectives, the following technical solutions are used in this disclosure.

According to a first aspect, an embodiment of this disclosure provides a phased array, including: a local oscillator signal adjustment path, a first adder, a first power divider, and a plurality of radio-frequency signal transmit channels. An output end of the local oscillator signal adjustment path is coupled to a first input end of the first adder, and is configured to input a first signal to the first adder. A second input end of the first adder is coupled to a transmit path, and is configured to receive a second signal from the transmit path, and the first adder superimposes (i.e., superposes) the first signal on the second signal to generate a to-be-transmitted signal. An input end of the first power divider is coupled to an output end of the first adder, an output end of the first power divider is coupled to input ends of the plurality of radio-frequency signal transmit channels, and the first power divider is configured to divide the to-be-transmitted signal into a plurality of transmit signals. Output ends of the plurality of radio-frequency signal transmit channels are coupled to a plurality of antennas, and the plurality of radio-frequency signal transmit channels are configured to process the plurality of transmit signals and transmit the plurality of transmit signals through the plurality of antennas.

In the phased array described in embodiments of this disclosure, the local oscillator signal adjustment path is introduced, and a local oscillator adjustment signal is introduced into the transmit signal using the first adder, to improve quality of communication signals.

In a possible implementation, each of the plurality of radio-frequency signal transmit channels in embodiments of this disclosure includes a power amplifier configured to perform power amplification on the plurality of transmit signals. Further, each of the plurality of radio-frequency signal transmit channels may further include a filter, where the filter is configured to filter the plurality of transmit signals.

In a possible implementation, an input end of the local oscillator signal adjustment path is coupled to a first local oscillator signal source. The local oscillator signal adjustment path is further configured to: receive a first local oscillator signal from the local oscillator signal source, and adjust the first local oscillator signal to generate the first signal.

The local oscillator signal adjustment path adjusts the first local oscillator signal to generate the first signal without arranging another signal source, thereby reducing a circuit layout area. In addition, the first signal can be generated by simply adjusting the first local oscillator signal, thereby reducing complexity of generating the first signal.

In a possible implementation, the local oscillator signal adjustment path includes a variable gain amplifier. The variable gain amplifier is configured to perform amplitude adjustment on the first local oscillator signal.

In a possible implementation, when the local oscillator signal adjustment path includes the variable gain amplifier, the local oscillator signal adjustment path may further include a frequency multiplier. The frequency multiplier is configured to perform frequency adjustment on the first local oscillator signal.

In a possible implementation, when the local oscillator signal adjustment path includes the variable gain amplifier, or when the local oscillator signal adjustment path includes the variable gain amplifier and the frequency multiplier, the local oscillator signal adjustment path further includes a first phase shifter. The first phase shifter is configured to perform phase adjustment on the first local oscillator signal.

In the local oscillator signal adjustment path described in embodiments of this disclosure, at least one of the variable gain amplifier, the frequency multiplier, or the first phase shifter is arranged, so that the first signal outputted by the local oscillator signal adjustment path can counterbalance a local oscillator leakage signal, thereby suppressing local oscillator leakage. For example, the first signal and the local oscillator leakage signal may have a same frequency, an equal amplitude, and opposite phases. It should be noted that, the opposite phases may mean that a phase difference is 180 degrees.

In a possible implementation, the transmit path includes a first frequency mixer and an intermediate-frequency signal processor. An output end of the intermediate-frequency signal processor is coupled to a first input end of the first frequency mixer. A second input end of the first frequency mixer is coupled to the first local oscillator signal source, an output end of the first frequency mixer is coupled to the second input end of the first adder, and the first frequency mixer is configured to input the second signal to the first adder.

In this implementation, the intermediate-frequency signal processor may generate an intermediate-frequency signal, and the first frequency mixer may receive the intermediate-frequency signal from the intermediate-frequency signal processor. After the first frequency mixer mixes the received intermediate-frequency signal with the first local oscillator signal, the second signal is generated and provided to the first adder. The intermediate-frequency signal described herein refers to a signal before being inputted into the frequency mixer, and may be a zero intermediate-frequency signal or a low intermediate-frequency signal.

In a possible implementation, the transmit path includes the first frequency mixer, a second frequency mixer, and the intermediate-frequency signal processor, and the phased array further includes a second local oscillator signal source. The output end of the intermediate-frequency signal processor is coupled to a first input end of the second frequency mixer, a second input end of the second frequency mixer is coupled to the second local oscillator signal source, and an output end of the second frequency mixer is coupled to the first input end of the first frequency mixer. A second input end of the first frequency mixer is coupled to the first local oscillator signal source, an output end of the first frequency mixer is coupled to the second input end of the first adder, and the first frequency mixer is configured to input the second signal to the first adder.

In this implementation, the intermediate-frequency signal processor may generate a first intermediate-frequency signal. The second frequency mixer may receive the first intermediate-frequency signal from the intermediate-frequency signal processor, receive a second local oscillator signal from the second local oscillator signal source, mix the first intermediate-frequency signal and the second local oscillator signal to generate a second intermediate-frequency signal, and provide the second intermediate-frequency signal to the first frequency mixer. After the first frequency mixer mixes the second intermediate-frequency signal and the first local oscillator signal, the second signal is generated and provided to the first adder.

In a possible implementation, the transmit path includes an intermediate-frequency signal processor. The second input end of the first adder is coupled to an output end of the intermediate-frequency signal processor, and is configured to receive the second signal from the intermediate-frequency signal processor. In this case, the second signal is an intermediate-frequency signal. The possible implementation includes the following several manners:

- Manner 1: The phased array further includes the first frequency mixer, and the output end of the first adder is coupled to an input end of the first frequency mixer. An output end of the first frequency mixer is coupled to the input end of the first power divider.
- Manner 2: Each radio-frequency signal transmit channel of the plurality of radio-frequency signal transmit channels further includes a first frequency mixer, and the phased array further includes a second power divider. A first input end of the first frequency mixer is coupled to the output end of the first power divider. A second input end of the first frequency mixer is coupled to an output end of the second power divider. The second power divider is configured to perform power division on the first local oscillator signal to generate a plurality of local oscillator signals. The first frequency mixer is configured to mix one local oscillator signal of the plurality of local oscillator signals with one of the plurality of transmit signals.

In a possible implementation, each of the plurality of radio-frequency signal transmit channels further includes: a second phase shifter, configured to perform phase shift on one of the plurality of transmit signals.

When each radio-frequency signal transmit channel further includes the first frequency mixer, the local oscillator signal adjustment path may include the first phase shifter, or may not include the first phase shifter. When the local oscillator signal adjustment path includes the first phase shifter, the second phase shifter in each radio-frequency signal transmit channel may be simultaneously adjusted, so that the second phase shifter in each radio-frequency signal transmit channel is first shifted to a fixed phase. The fixed phase is based on a phase difference between the local oscillator signal and the first signal. Based on this, the second phase shifter in each radio-frequency signal transmit channel is continuously adjusted, so that the phased array transmits a beamformed signal.

According to a second aspect, an embodiment of this disclosure provides a transceiver. The transceiver includes a local oscillator signal adjustment path, a first adder, and a radio-frequency signal transmit channel. An output end of the local oscillator signal adjustment path is coupled to a first input end of the first adder, and is configured to input a first signal to the first adder. A second input end of the first adder is coupled to a transmit path, and is configured to receive a second signal, and the first adder superimposes the first signal on the second signal to generate a to-be-transmitted signal. An input end of the radio-frequency signal transmit channel is coupled to an output end of the first adder, an output end of the radio-frequency signal transmit channel is coupled to an antenna, and the radio-frequency signal transmit channel is configured to process a plurality of transmit signals, and transmit the to-be-transmitted signal through the antenna.

In the phased array described in embodiments of this disclosure, quality of communication signals can be improved by arranging the local oscillator signal adjustment path.

In a possible implementation, the radio-frequency signal transmit channel in embodiments of this disclosure may include a power amplifier configured to perform power amplification on the to-be-transmitted signal. Further, the radio-frequency signal transmit channel may further include a filter, where the filter is configured to filter the plurality of transmit signals.

In a possible implementation, an input end of the local oscillator signal adjustment path is coupled to a first local oscillator signal source. The local oscillator signal adjustment path is further configured to: receive a first local oscillator signal from the local oscillator signal source, and adjust the first local oscillator signal to generate the first signal.

The local oscillator signal adjustment path adjusts the first local oscillator signal to generate the first signal without arranging another signal source, thereby reducing a circuit layout area. In addition, because the first signal and the first local oscillator signal have a same frequency and amplitude and opposite phases, the first signal can be generated by simply adjusting the first local oscillator signal, thereby reducing complexity of generating the first signal.

In a possible implementation, the local oscillator signal adjustment path includes a variable gain amplifier. The variable gain amplifier is configured to perform amplitude adjustment on the first local oscillator signal.

In a possible implementation, when the local oscillator signal adjustment path includes the variable gain amplifier, the local oscillator signal adjustment path may further include a frequency multiplier. The frequency multiplier is configured to perform frequency adjustment on the first local oscillator signal.

In a possible implementation, when the local oscillator signal adjustment path includes the variable gain amplifier, or when the local oscillator signal adjustment path includes the variable gain amplifier and the frequency multiplier, the local oscillator signal adjustment path further includes a first phase shifter. The first phase shifter is configured to perform phase adjustment on the first local oscillator signal.

In the local oscillator signal adjustment path described in embodiments of this disclosure, at least one of the variable gain amplifier, the frequency multiplier, or the first phase shifter is arranged, so that the first signal outputted by the local oscillator signal adjustment path can counterbalance a local oscillator leakage signal, thereby suppressing local oscillator leakage. For example, the first signal and the local oscillator leakage signal may have a same frequency, an equal amplitude, and opposite phases. It should be noted that, the opposite phases may mean that a phase difference is 180 degrees.

In a possible implementation, the transmit path includes a first frequency mixer and an intermediate-frequency signal processor. An output end of the intermediate-frequency signal processor is coupled to a first input end of the first frequency mixer. A second input end of the first frequency mixer is coupled to the first local oscillator signal source, an output end of the first frequency mixer is coupled to the second input end of the first adder, and the first frequency mixer is configured to input the second signal to the first adder.

In this implementation, the intermediate-frequency signal processor may generate an intermediate-frequency signal, and the first frequency mixer may receive the intermediate-frequency signal from the intermediate-frequency signal processor. After the first frequency mixer mixes the received intermediate-frequency signal with the first local oscillator signal, the second signal is generated and provided to the first adder.

In a possible implementation, the transmit path includes the first frequency mixer, a second frequency mixer, and the intermediate-frequency signal processor, and the phased array further includes a second local oscillator signal source. The output end of the intermediate-frequency signal processor is coupled to a first input end of the second frequency mixer, a second input end of the second frequency mixer is coupled to the second local oscillator signal source, and an output end of the second frequency mixer is coupled to the first input end of the first frequency mixer. A second input end of the first frequency mixer is coupled to the first local oscillator signal source, an output end of the first frequency mixer is coupled to the second input end of the first adder, and the first frequency mixer is configured to input the second signal to the first adder.

In this implementation, the intermediate-frequency signal processor may generate a first intermediate-frequency signal. The second frequency mixer may receive the first intermediate-frequency signal from the intermediate-frequency signal processor, receive a second local oscillator signal from the second local oscillator signal source, mix the first intermediate-frequency signal and the second local oscillator signal to generate a second intermediate-frequency signal, and provide the second intermediate-frequency signal to the first frequency mixer. After the first frequency mixer mixes the second intermediate-frequency signal and the first local oscillator signal, the second signal is generated and provided to the first adder.

In a possible implementation, the transmit path includes the intermediate-frequency signal processor, and the phased array further includes the first frequency mixer. The second input end of the first adder is coupled to the output end of the intermediate-frequency signal processor, and the output end of the first adder is coupled to an input end of the first frequency mixer. The second input end of the first adder is configured to receive the second signal from the intermediate-frequency signal processor. In this case, the second signal is an intermediate-frequency signal.

In a possible implementation, the radio-frequency signal transmit channel further includes: a second phase shifter, configured to perform phase shift on one of the plurality of transmit signals.

In a possible implementation, the transmit path further includes the stray adjustment circuit and the second adder. A first input end of the stray adjustment circuit is coupled to the first local oscillator signal source, a second input end of the stray adjustment circuit is coupled to the intermediate-frequency signal processor, and an output end of the stray adjustment circuit is coupled to a first input end of the second adder. The output end of the first frequency mixer is coupled to a second input end of the second adder, and an output end of the second adder is coupled to the second input end of the first adder. The stray adjustment circuit generates a third signal based on a local oscillator signal outputted by the first local oscillator signal source and an intermediate-frequency signal outputted by the intermediate-frequency signal processor, and provides the third signal to the second adder, and the second adder superimposes the third signal on a signal outputted by the first frequency mixer to generate the second signal.

In a possible implementation, the transmit path further includes the stray adjustment circuit and the second adder. The first input end of the stray adjustment circuit is coupled to the first local oscillator signal source, the second input end of the stray adjustment circuit is coupled to the output end of the first adder, and the output end of the stray adjustment circuit is coupled to the first input end of the second adder. The output end of the first frequency mixer is coupled to the second input end of the second adder, and the output end of the second adder is coupled to the input end of the first power divider. The stray adjustment circuit generates a third signal based on the local oscillator signal outputted by the first local oscillator signal source and a signal outputted by the first adder, and provides the third signal to the second adder, and the second adder superimposes the third signal on the signal outputted by the first frequency mixer to generate the to-be-transmitted signal.

In a possible implementation, the stray adjustment circuit includes a third phase shifter and a third frequency mixer. The third phase shifter is coupled between the first local oscillator signal source and a first input end of the third frequency mixer. A second input end of the third frequency mixer is coupled to one of the output end of the intermediate-frequency signal processor or the output end of the first adder, and an output end of the third frequency mixer is coupled to the first input end of the second adder.

In a possible implementation, the stray adjustment circuit further includes a fourth phase shifter. The fourth phase shifter is coupled between the first local oscillator signal source and the second input end of the first frequency mixer.

In a possible implementation, the stray adjustment circuit further includes a fourth phase shifter. One end of the fourth phase shifter is coupled to one of the output end of the intermediate-frequency signal processor or the output end of the first adder, and the other end of the fourth phase shifter is coupled to a second input end of the third frequency mixer.

In a possible implementation, each of the plurality of radio-frequency signal transmit channels further includes the stray adjustment circuit and the second adder. The first input end of the stray adjustment circuit is coupled to an output end of a second power divider, the second input end of the stray adjustment circuit is coupled to the output end of the first power divider, and the output end of the stray adjustment circuit is coupled to the first input end of the second adder. The output end of the first frequency mixer is coupled to the second input end of the second adder, and the output end of the second adder is coupled to the input end of the first power divider. The stray adjustment circuit is configured to process one local oscillator signal of the plurality of local oscillator signals and one of the plurality of transmit signals. The second adder is configured to superimpose a signal outputted by the stray adjustment circuit on the signal outputted by the first frequency mixer.

In a possible implementation, the stray adjustment circuit includes a third phase shifter and a third frequency mixer. The third phase shifter is coupled between the output end of the second power divider and a first input end of the third frequency mixer. A second input end of the third frequency mixer is coupled to the output end of the first power divider. An output end of the third frequency mixer is coupled to the first input end of the second adder.

In a possible implementation, the stray adjustment circuit further includes a fourth phase shifter. The fourth phase shifter is coupled between the output end of the second power divider and the second input end of the first frequency mixer.

In a possible implementation, the stray adjustment circuit further includes a fourth phase shifter. The fourth phase shifter is coupled between the output end of the first power divider and the second input end of the third frequency mixer.

According to a third aspect, an embodiment of this disclosure provides an electronic device. The electronic device includes a circuit board, the transceiver and the processor in the foregoing possible implementations are arranged on the circuit board, and the transceiver includes the phased array in the foregoing possible implementations.

BRIEF DESCRIPTION OF DRAWINGS

To describe the technical solutions in embodiments of this disclosure more clearly, the following briefly describes the accompanying drawings used in describing embodiments of this disclosure. It is clear that the accompanying drawings in the following description show merely some embodiments of this disclosure, and a person of ordinary skill in the art may still derive another drawing from these accompanying drawings without creative efforts.

DESCRIPTION OF EMBODIMENTS

Figure 1:
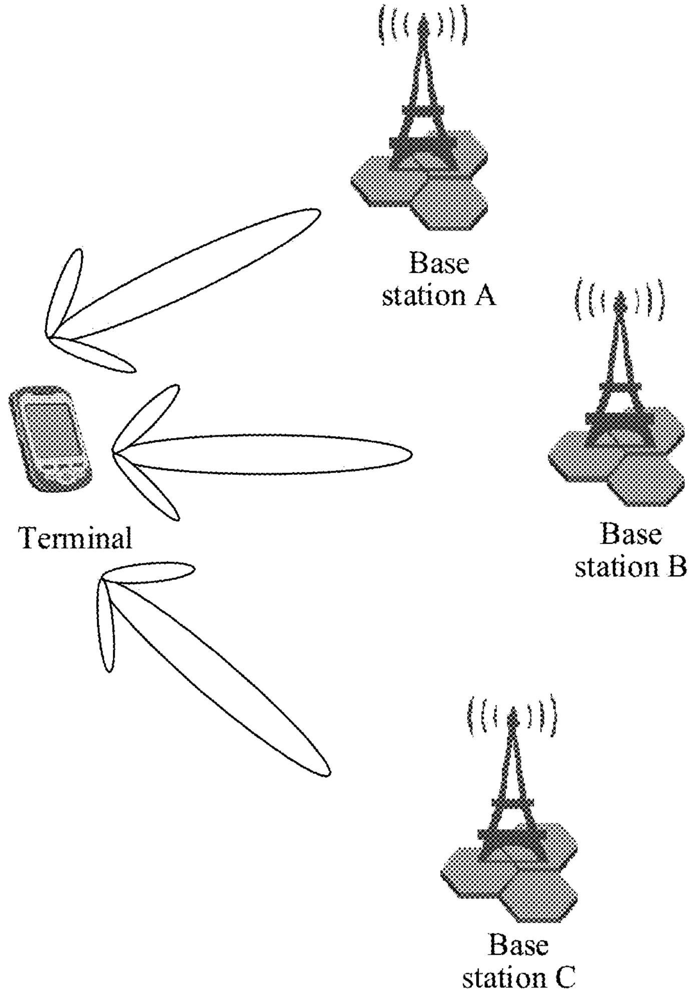
FIG. 1 is a schematic diagram of a structure of a wireless communication system according to an embodiment of this disclosure.

The following clearly describes the technical solutions in embodiments of this disclosure with reference to the accompanying drawings in embodiments of this disclosure. It is clear that the described embodiments are some but not all of embodiments of this disclosure. All other embodiments obtained by a person of ordinary skill in the art based on embodiments of this disclosure without creative efforts shall fall within the protection scope of this disclosure.

The "first", the "second" and similar terms mentioned herein do not indicate any order, quantity or significance, but are used to only distinguish different components. Similarly, "one", "a", and similar terms also do not indicate a quantity limitation, but indicates that there is at least one. "Connection", "coupling", and similar terms are not limited to a physical or mechanical connection, but may include an electrical connection, regardless of a direct or indirect connection, which is equivalent to coupling or communication in a broad sense.

In embodiments of this disclosure, the terms such as "example" or "for example" are used to represent giving an example, an illustration, or a description. Any embodiment or design scheme described as an "example" or "for example" in embodiments of this disclosure should not be explained as being more preferred or having more advantages than another embodiment or design scheme. Exactly, use of the terms such as "example" or "for example" is intended to present a relative concept in a specific manner. In the description of embodiments of this disclosure, unless otherwise stated, "a plurality of" means two or more. For example, a plurality of radio-frequency signal transmit channels are two or more radio-frequency signal transmit channels.

In a wireless communication system, devices may be classified into devices that provide a wireless network service and devices that use a wireless network service. The devices that provide the wireless network service are devices that form a wireless communication network, and may be briefly referred to as network devices) or network elements. The network devices generally belong to operators (for example, China Mobile and Vodafone) or infrastructure providers (for example, China Tower), and are operated or maintained by these vendors. The network devices may be further classified into radio access network (RAN) devices and core network (CN) devices. Typical RAN devices include a base station (BS).

It should be understood that, the BS sometimes may also be referred to as a wireless access point (AP) or a transmission reception point (TRP). The BS may be a generation NodeB (gNB) in a 5G new radio (NR) system or an evolved NodeB (eNB) in a 4G Long-Term Evolution (LTE) system. BSs may be classified into a macro BS and a micro BS based on different physical forms or transmit powers of the BSs. The micro BS sometimes is also referred to as a miniature BS or a small cell.

The devices that use the wireless network service are generally located on an edge of a network, and may be briefly referred to as terminals. A terminal can establish a connection to a network device, and provides a specific wireless communication service for a user based on a service of the network device. It should be understood that, because the terminal has a closer relationship with the user, the terminal sometimes is also referred to as user equipment (UE) or a subscriber unit (SU). In addition, compared with a BS that is generally placed at a fixed location, the terminal usually moves along with the user, and sometimes is also referred to as a mobile station (MS). In addition, some network devices such as a relay node (RN) or a wireless router sometimes may also be considered as terminals because the network devices have a UE identity or belong to a user.

The terminal may be a mobile phone, a tablet computer, a laptop computer, a wearable device (for example, a smart watch, a smart band, a smart helmet, or smart glasses), or other devices that have a wireless access capability, for example, an intelligent vehicle and various Internet of things (IoT) devices including various smart home devices (such as a smart meter and a smart home appliance) and smart city devices (such as a security or monitoring device and an intelligent road transportation facility).

For ease of description, technical solutions in embodiments of this disclosure are described in detail by using the BS and the terminal as examples in this disclosure.

FIG. 1 is a schematic diagram of a structure of a wireless communication system according to an embodiment of this disclosure. As shown in FIG. 1, the wireless communication system includes a terminal, a BS A, a BS B, and a BS C.

The wireless communication system may comply with a Third Generation Partnership Project (3GPP) wireless communication standard, or may comply with another wireless communication standard, for example, an Institute of Electrical and Electronics Engineers (IEEE) 802 series (such as 802.11, 802.15, or 802.20) wireless communication standard.

Although FIG. 1 shows merely three BSs and one terminal, the wireless communication system may alternatively include other quantities of terminals and BSs. In addition, the wireless communication system may further include another network device, for example, a CN device.

The terminal and the BS need to learn of configurations predefined by the wireless communication system, including a radio access technology (RAT) supported by the system and a radio resource configuration specified by the system, for example, a basic configuration of a radio band and carrier. A carrier is a frequency range that complies with a specification of the system. The frequency range may be determined jointly based on a center frequency of the carrier (defined as a carrier) and a bandwidth of the carrier. The configurations predefined by the system may be used as a part of a standard protocol for the wireless communication system, or may be determined through interaction between the terminal and the BS. Content of a related standard protocol may be prestored in memories of the terminal and the BS, or embodied as hardware circuits or software code of the terminal and the BS.

In the wireless communication system, the terminal and the BS support one or more same RATs, for example, the 5G NR or a RAT of a future evolution system. The terminal and the BS use the same air interface parameter, coding scheme, modulation scheme, and the like, and communicate with each other based on a radio resource specified by the system.

In FIG. 1, the terminal integrating a phased array may directionally point to the BS A, the BS B, and the BS C respectively through different configurations. Compared with another terminal, a terminal having a phased array function can implement a more centralized energy transmission using the phased array function, thereby reducing a path loss of signal transmission at a high frequency range, especially in a millimeter wave frequency range, to some extent.

Figure 2:
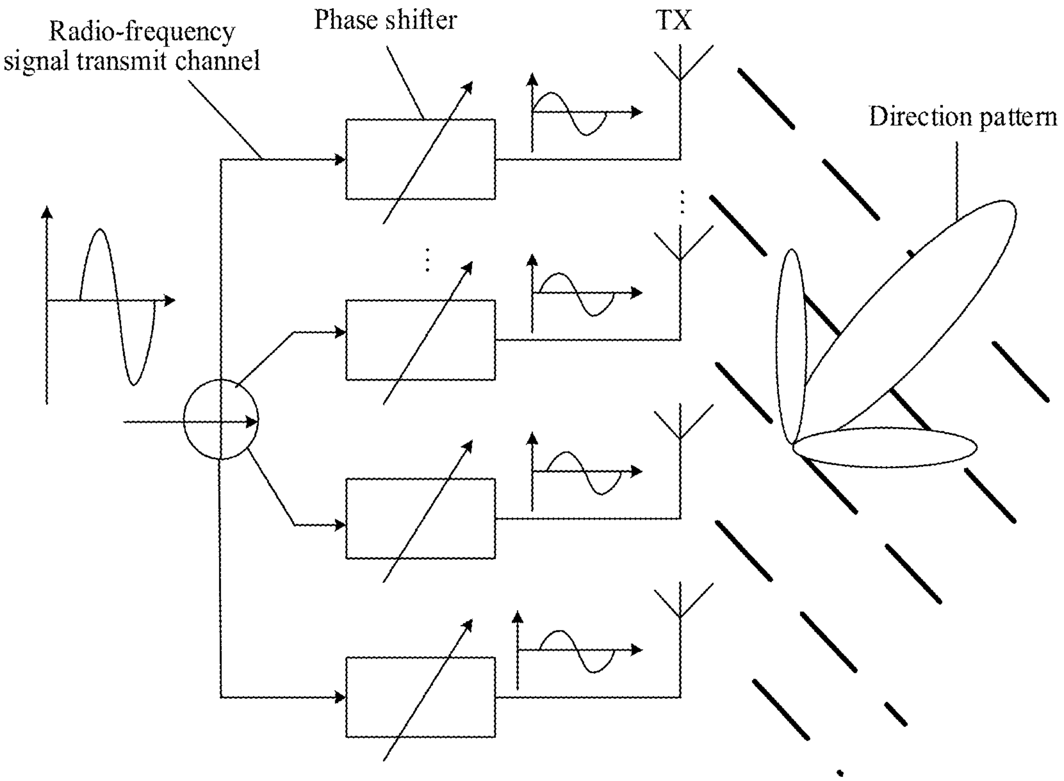
FIG. 2 is a schematic diagram of an architecture of a phased array according to an embodiment of this disclosure.

FIG. 2 is a schematic diagram of an architecture of a phased array according to an embodiment of this disclosure. The phased array shown in FIG. 2 may be applied to the application scenario shown in FIG. 1. In FIG. 2, the phased array may include a plurality of radio-frequency signal transmit channels, an output end of each radio-frequency signal transmit channel is coupled to an antenna TX, and each radio-frequency signal transmit channel includes a corresponding phase shifter. When the phased array needs to point to a specific direction to implement a beam in the specific direction, the phase shifter in the phased array may perform phase shift on a signal of a corresponding radio-frequency signal transmit channel, to obtain a direction pattern in the specific direction. When the phased array needs to dynamically cover a plurality of directions, the phased array may be implemented in a phase scanning manner. Because a phased array system requires a large scanning angle, there are specific requirements on a phase shift precision and a phase shift range of the phase shifter of each radio-frequency signal transmit channel. For convenience of system control, optionally, a digital phase shifter technology may be used in the phased array. Each branch needs to adjust a phase of each branch by changing a digital control bit within a phase shift range implemented by n bits, to implement phase scanning.

Figure 3:
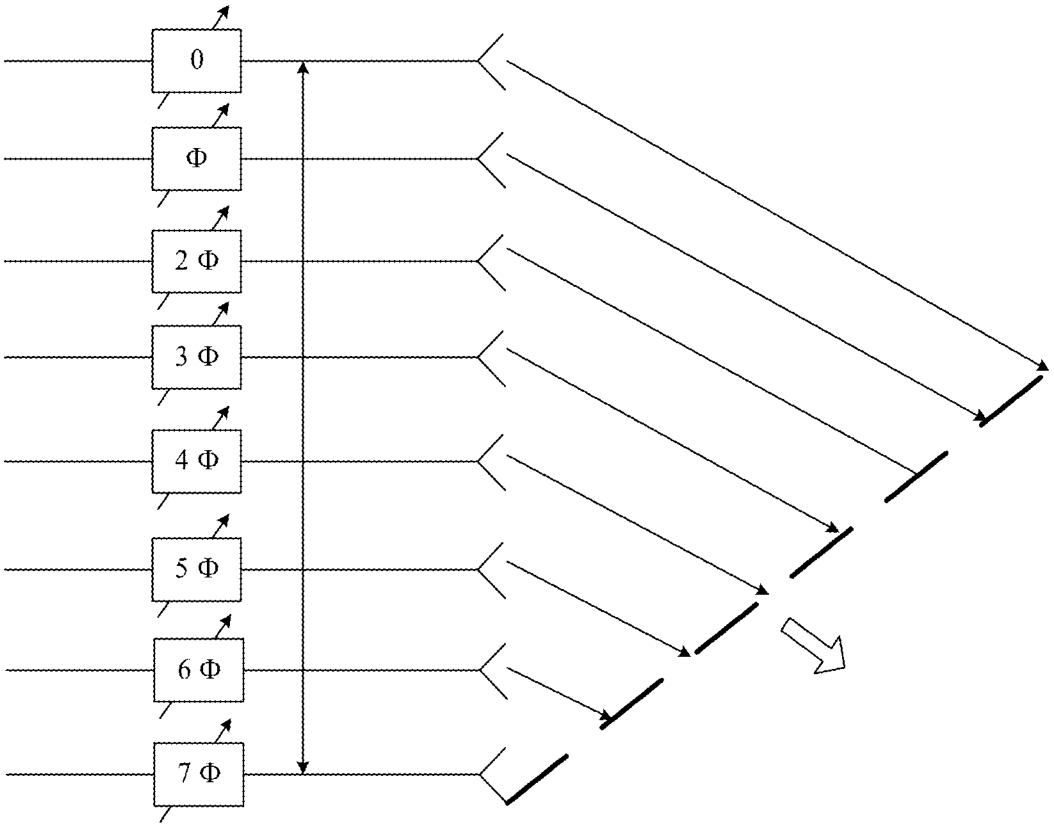
FIG. 3 is a schematic diagram of a working principle of a phased array according to an embodiment of this disclosure.

FIG. 3 is used as an example. A phased array architecture shown in FIG. 3 includes eight branches. To implement full range coverage, each branch needs to implement a 3-bit digital phase shifter, that is, a phase range implemented by the eight branches is 0-7Φ, and the eight branches correspond to a phase shift range of digital control bits 000-111. Different bits have different phase shift precisions. Using 3 bits as an example, a lowest bit in the 3 bits corresponds to a phase shift precision of $2^0\Phi=\Phi$, and a middle bit corresponds to a phase shift precision of $2^1\Phi=2\Phi$, and a highest bit corresponds to a phase shift precision of $2^2\Phi=4\Phi$. In this way, generally, a phase shift range of 360 degrees may be implemented based on 0-7Φ, and each phase shift unit Φ is 45 degrees. A minimum shifted phase of each branch is 0Φ, that is, 0 degrees, a control digital of a bit of a corresponding phase shifter is 000, a maximum shifted phase is 7Φ, that is, 315 degrees, and a control digital of a bit of a corresponding phase shifter is 111. To achieve a higher phase scanning precision, the bits may be added. For example, the digital phase shifter may alternatively be a 4-bit digital phase shifter, and a minimum phase shift precision Φ of each branch may be 22.5 degrees. After learning of a working principle of the phased array, it may be understood that, to implement a signal transmit function of the phased array, devices such as a power amplifier and a phase shifter need to be integrated into each radio-frequency signal transmit channel in the foregoing embodiment.

Figure 4:
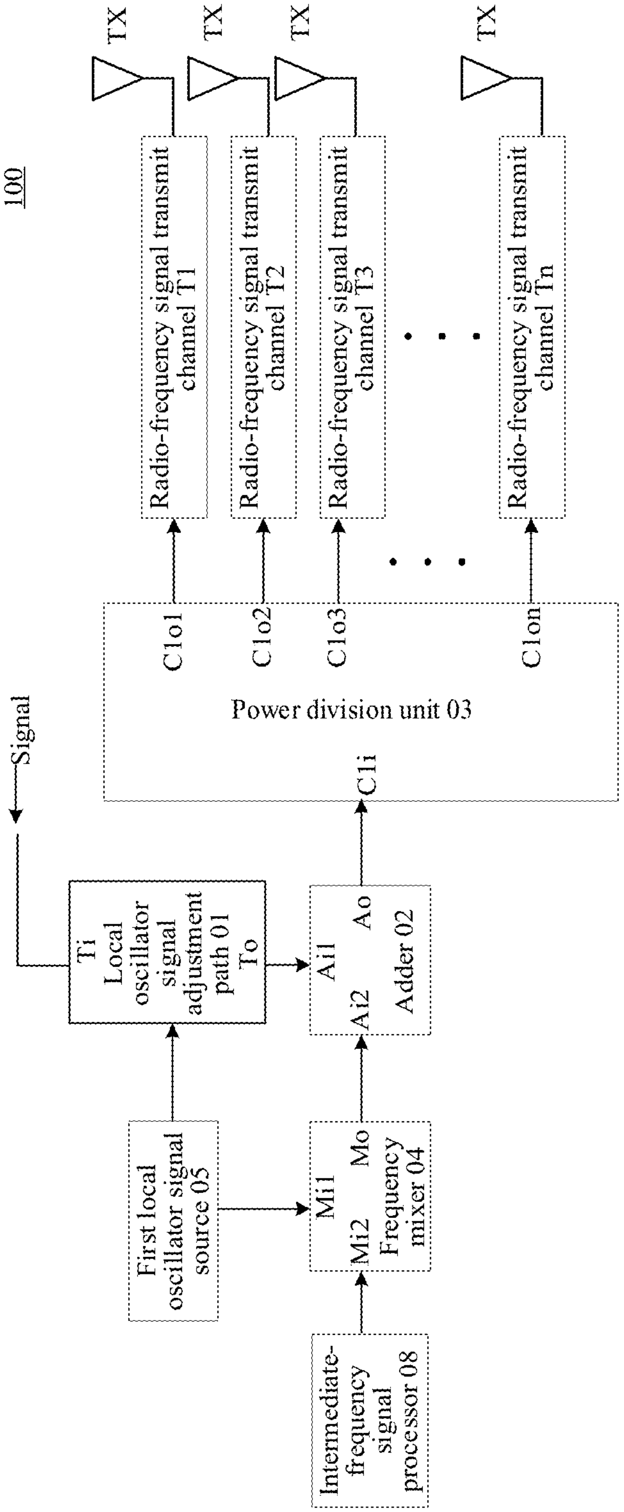
FIG. 4 is a schematic diagram of a structure of a phased array according to an embodiment of this disclosure.

The following describes in detail the phased array described in embodiments of this disclosure. FIG. 4 is a schematic diagram of a structure of a phased array 100 according to an embodiment of this disclosure. In FIG. 4, the phased array 100 includes a local oscillator signal adjustment path 01, an adder 02, a power division unit 03, a frequency mixer 04, and radio-frequency signal transmit channels T1, T2, T3, . . . , and Tn.

Figure 5:
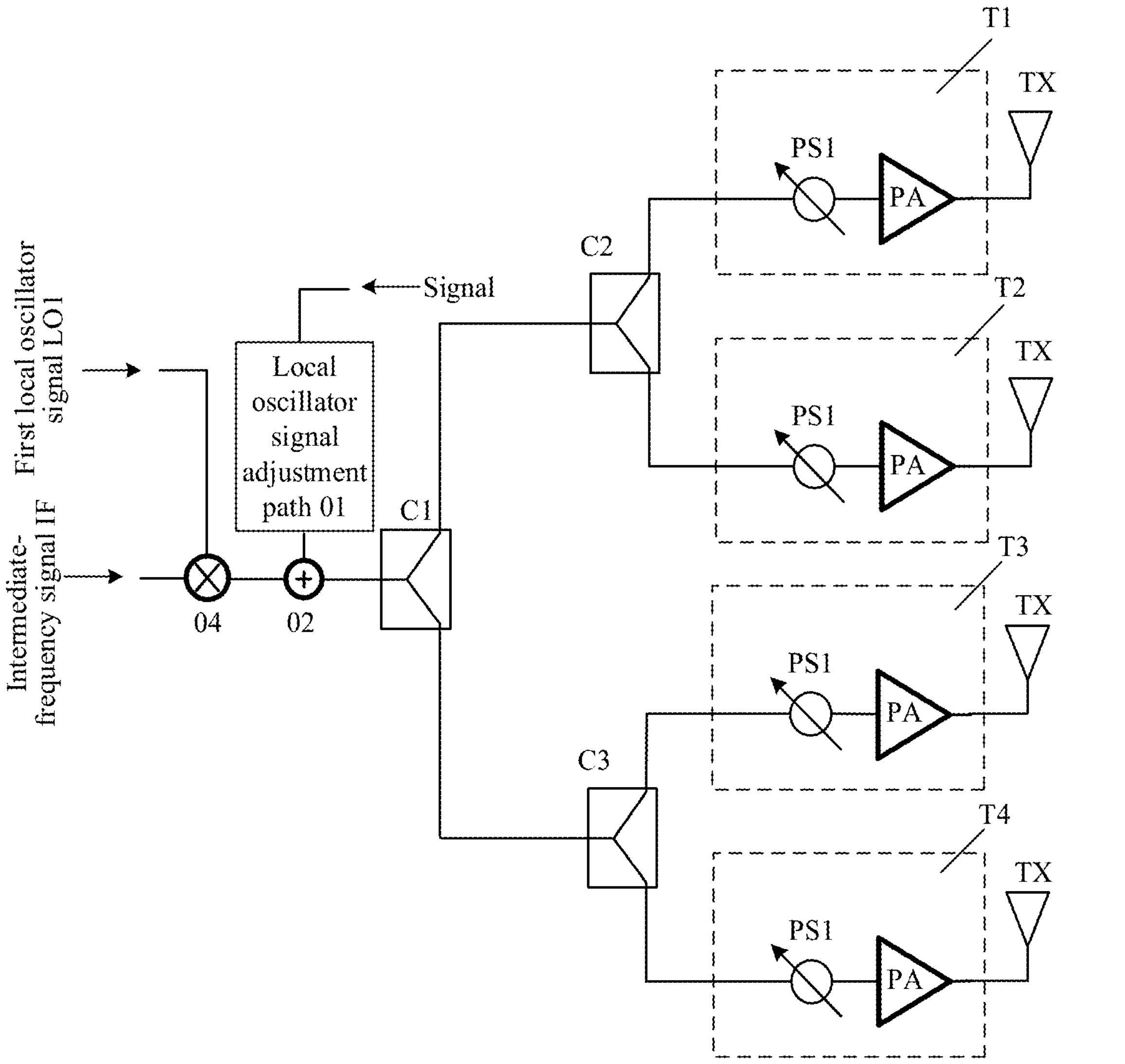
FIG. 5 is a schematic diagram of a specific structure of the phased array shown in FIG. 4 according to an embodiment of this disclosure.

An output end To of the local oscillator signal adjustment path 01 is coupled to a first input end Ai1 of the adder 02. An input end Mi1 of the frequency mixer 04 is coupled to a first local oscillator signal source 05, and an input end Mi2 of the frequency mixer 04 is configured to input an intermediate-frequency signal IF. An output end Mo of the frequency mixer 04 is coupled to a second input end Ai2 of the adder 02. In a possible implementation, a local oscillator buffer (not shown in the figure) may be further arranged between the first local oscillator signal source 05 and the frequency mixer 04, to amplify a local oscillator signal. An output end Ao of the adder 02 is coupled to an input end C1*i* of the power division unit 03. The power division unit 03 includes output ends C1*o*1, C1*o*2, C1*o*3, . . . , and C1*on*, and the output ends C1*o*1, C1*o*2, C1*o*3, . . . , and C1*on* of the power division unit 03 are coupled to input ends of the radio-frequency signal transmit channels T1, T2, T3, . . . , and Tn in a one-to-one correspondence. Output ends of the radio-frequency signal transmit channels T1, T2, T3, . . . , and Tn are respectively coupled to transmit antennas TXs in a one-to-one correspondence. Each radio-frequency signal transmit channel may further include a component such as a power amplifier, a phase shifter, or a filter. It should be noted that, a quantity of the radio-frequency signal transmit channels is not limited in this embodiment of this disclosure. The phased array may include two radio-frequency signal transmit channels, or may include three radio-frequency signal transmit channels, or the like. Similarly, the power division unit 03 may include at least one power divider. For example, two power dividers or three power dividers may be included. This is not limited in this embodiment of this disclosure. A quantity of power dividers included in the power division unit 03 is based on a scenario requirement and the quantity of the radio-frequency signal transmit channels. For example, the power division unit 03 includes three power dividers, which are respectively a power divider C1, a power divider C2, and a power divider C3. An input end of the power divider C1 is coupled to the output end of the adder 02, one output end of the power divider C1 is coupled to an input end of the power divider C2, and the other output end of the power divider C1 is coupled to an input end of the power divider C3. Two output ends of the power divider C2 and two output ends of the power divider C3 are used as the output ends Co1, Co2, Co3, and Co4 of the power division unit 03. In this case, there may be four radio-frequency signal transmit channels, which are respectively radio-frequency signal transmit channels T1, T2, T3, and T4, as shown in FIG. 5. FIG. 5 is a schematic diagram of a specific structure of the phased array 100 shown in FIG. 4. In addition, FIG. 5 schematically shows that each radio-frequency signal transmit channel may further include a power amplifier PA and a phase shifter PS1. It should be noted that, the intermediate-frequency signal IF in this embodiment of this disclosure is a signal before being inputted into the frequency mixer 04, and may be a zero intermediate-frequency signal or a low intermediate-frequency signal. In an application scenario of a millimeter wave, a center frequency of the intermediate-frequency signal may be on an order of magnitude of gigahertz (GHz).

Still refer to FIG. 4. In this embodiment, the local oscillator signal adjustment path 01 may adjust a signal inputted by an input end Ti, generate a first signal, and provide the first signal to the adder 02. The input end Mi1 of the frequency mixer 04 is configured to input a local oscillator signal LO1. After mixing the local oscillator signal LO1 with the intermediate-frequency signal IF inputted by the input end Mi2, the frequency mixer 04 generates a second signal and provides the second signal to the adder 02. The adder 02 superimposes the first signal on the second signal and then generates a to-be-transmitted signal. The power dividers in the power division unit 03 divide the to-be-transmitted signal into a plurality of transmit signals, and respectively provides the plurality of transmit signals to the radio-frequency signal transmit channels T1, T2, T3, . . . , and Tn. The radio-frequency signal transmit channels T1, T2, T3, . . . , and Tn perform processing such as filtering or power amplification on the plurality of transmit signals and then transmit the plurality of transmit signals through a plurality of antennas TXs.

In this embodiment of this disclosure, the intermediate-frequency signal IF inputted into the input end Mi2 of the frequency mixer 04 may be generated by an intermediate-frequency signal processor 08. As shown in FIG. 4, the phased array shown in FIG. 4 further includes the intermediate-frequency signal processor 08. The input end Mi1 of the frequency mixer 04 is coupled to an output end of the intermediate-frequency signal processor 08, and is configured to obtain the intermediate-frequency signal IF from the intermediate-frequency signal processor 08. The intermediate-frequency signal processor 08 in this embodiment of this disclosure may include, for example, but not limited to, a component such as a filter or an analog-to-digital converter.

Figure 6:
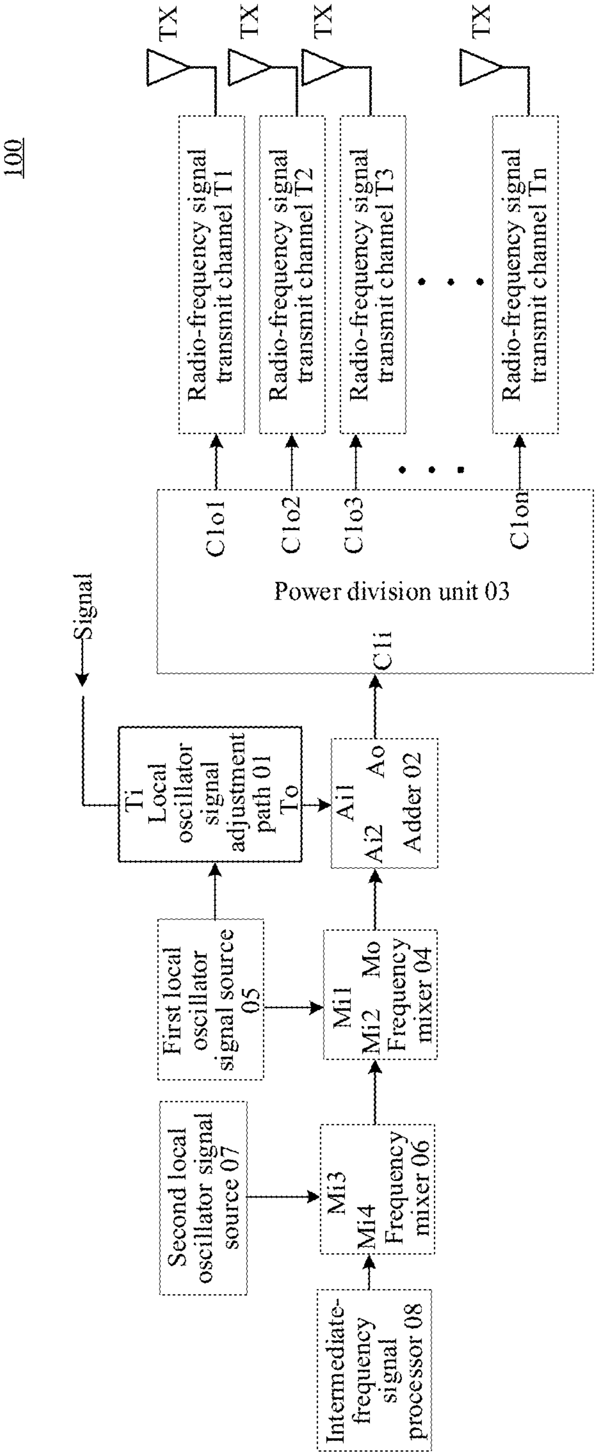
FIG. 6 is a schematic diagram of another structure of a phased array according to an embodiment of this disclosure.

It can be learned from FIG. 4 and FIG. 5 that, the phased array 100 shown in FIG. 4 and FIG. 5 includes one frequency mixer 04. In a possible implementation, the phased array 100 in this embodiment of this disclosure may include a plurality of frequency mixers. FIG. 6 shows a case in which the phased array 100 includes two frequency mixers. As shown in FIG. 6, the phased array 100 may further include a frequency mixer 06 and a second local oscillator signal source 07 in addition to components same as those in the phased array 100 shown in FIG. 4. An input end Mi3 of the frequency mixer 06 is coupled to the second local oscillator signal source 07, an input end Mi4 of the frequency mixer 06 is coupled to the output end of the intermediate-frequency signal processor 08, and an output end of the frequency mixer 06 is coupled to the input end Mi2 of the frequency mixer 04. A connection relationship of the remaining components is the same as the connection relationship of the components in the phased array 100 shown in FIG. 4. Details are not described herein again. In FIG. 6, the input end Mi3 of the frequency mixer 06 receives a local oscillator signal LO2 from the second local oscillator signal source 07, and the input end Mi4 of the frequency mixer 06 receives an intermediate-frequency signal IN from the intermediate-frequency signal processor 08. After mixing the local oscillator signal LO2 with the intermediate-frequency signal IN, the foregoing intermediate-frequency signal IF is generated, and the intermediate-frequency signal IF is provided to the frequency mixer 04. That is, in the phased array 100 shown in FIG. 6, the intermediate-frequency signal IF inputted into the frequency mixer 04 is generated after the frequency mixer 06 mixing the intermediate-frequency signal IN generated by the intermediate-frequency signal processor 08.

It should be noted that, the first local oscillator signal source 05 and the second local oscillator signal source 07 may be two different local oscillator signal generation devices. In addition, the first local oscillator signal source 05 and the second local oscillator signal source 07 may alternatively be arranged in a same local oscillator signal generation device. When the first local oscillator signal source 05 and the second local oscillator signal source 07 are arranged in a same local oscillator signal generation device, in an example, the local oscillator signal generation device may be provided with two signal output ports. One signal output port is configured to output the local oscillator signal LO1, and in this case, the input end Mi1 of the frequency mixer 04 is coupled to the port. The other port of the local oscillator signal generation device is configured to output the local oscillator signal LO2, and in this case, the first input end of the frequency mixer 06 is coupled to the port.

It should be further noted that, the first local oscillator signal source 05 and the second local oscillator signal source 07 that are configured to generate the local oscillator signal LO1 and the local oscillator signal LO2 may be arranged in the phased array 100, or may be arranged outside the phased array 100. When the first local oscillator signal source 05 and the second local oscillator signal source 07 are arranged outside the phased array 100, the phased array 100 may be further provided with two local oscillator signal input ports. One local oscillator signal input port is configured to input the local oscillator signal LO1, and the other input port is configured to input the local oscillator signal LO2, which are not shown in the figure.

Compared with the other communication technologies, the phased array in this embodiment of this disclosure can filter out a local oscillator leakage signal in the phased array while reducing power consumption and a layout area of a communication device.

Usually, in addition to a radio-frequency signal, the second signal outputted by the frequency mixer 04 further includes a local oscillator signal leaked from the frequency mixer 04, that is, the local oscillator leakage signal. The local oscillator leakage signal usually causes interference to the radio-frequency signal, affecting performance of the transmitted radio-frequency signal. In the phased array described in this embodiment of this disclosure, quality of communication signals can be improved by arranging the local oscillator signal adjustment path. Further, to resolve a problem of local oscillator leakage, in other communication technologies, a filter circuit is usually arranged at an output end of a frequency mixer to filter out the local oscillator leakage signal, or an in-phase and quadrature (IQ) transmitter is used to perform direct current offset calibration on an IQ radio-frequency circuit to suppress the local oscillator leakage signal. In the current technology, power consumption of the communication device is inevitably increased regardless of whether the filter circuit is used or the IQ transmitter is used. When another solution for local oscillator leakage is applied to the phased array, a plurality of filter circuits or IQ transmitters usually need to be arranged, greatly increasing the layout area of the communication device, and further increasing production and manufacturing costs of the communication device. Compared with another communication technologies, the phased array and an electronic device including the phased array in this embodiment of this disclosure can filter out the local oscillator leakage signal in the phased array while reducing the power consumption and the layout area of the communication device.

In this embodiment of this disclosure, the local oscillator signal used for frequency mixing with the intermediate-frequency signal IF usually has a specific amplitude and phase, that is, the local oscillator leakage signal has a specific amplitude and phase. In this embodiment of this disclosure, the local oscillator signal adjustment path 01 is arranged, so that the first signal outputted by the local oscillator signal adjustment path 01 can counterbalance the local oscillator leakage signal, thereby suppressing local oscillator leakage. For example, the local oscillator signal adjustment path 01 processes an inputted signal, so that the first signal and the local oscillator leakage signal have a same frequency, an equal amplitude, and opposite phases, and the first signal can counterbalance the local oscillator leakage signal. It should be noted that, the opposite phases in this embodiment of this disclosure may mean that a phase difference is 180 degrees. The following describes a specific structure of the local oscillator signal adjustment path 01.

Figure 7A:
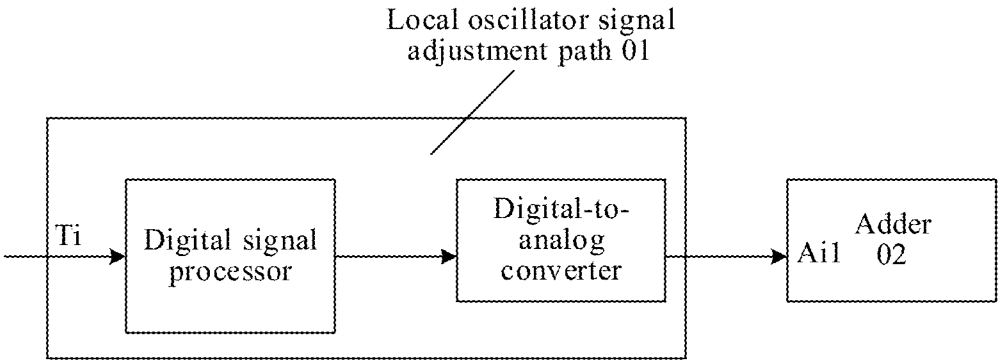
FIG. 7A is a schematic diagram of a structure of a local oscillator signal adjustment path according to an embodiment of this disclosure.

In a first possible implementation, the local oscillator signal adjustment path 01 may include a digital signal processor and a digital-to-analog converter, as shown in FIG. 7A. An input end of the digital signal processor is the input end Ti of the local oscillator signal adjustment path 01, an output end of the digital signal processor is coupled to an input end of the digital-to-analog converter, and an output end of the digital-to-analog converter is coupled to the first input end Ai1 of the adder 02. The digital signal processor and the digital-to-analog converter may generate the first signal, where the first signal and the local oscillator leakage signal have a same frequency, an equal amplitude, and opposite phases, thereby suppressing the local oscillator leakage signal. In addition to the local oscillator signal, the signal inputted into the frequency mixer 04 usually further includes various orders of harmonic signals of the local oscillator signal. Therefore, the local oscillator leakage signal usually includes the local oscillator signal and the various orders of harmonic signals of the local oscillator signal. The first signal may include a signal, where the signal and the local oscillator signal have a same frequency, an equal amplitude, and opposite phases, and the first signal may further include a signal, where the signal and the various orders of harmonic signals of the local oscillator signal have a same frequency, an equal amplitude, and opposite phases.

Figure 7B:
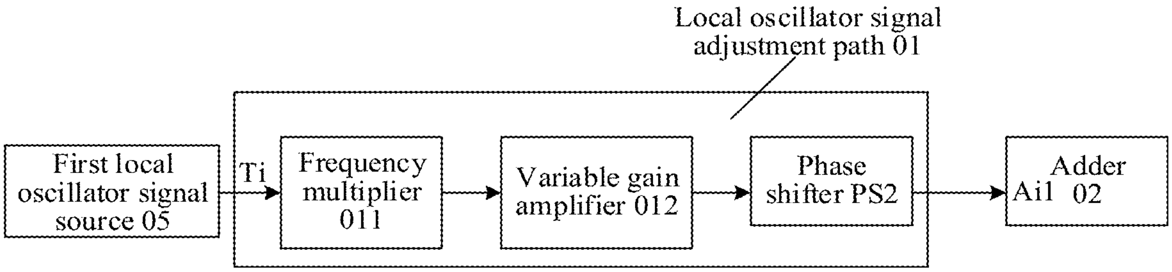
FIG. 7B is a schematic diagram of another structure of a local oscillator signal adjustment path according to an embodiment of this disclosure.

In a second possible implementation, the local oscillator signal adjustment path 01 may include a variable gain amplifier 012 and a phase shifter PS2, as shown in FIG. 7B. Usually, when a local oscillator signal or a harmonic signal of a specific frequency in the local oscillator leakage signal causes greatest interference to the radio-frequency signal, interference of a local oscillator leakage signal of another frequency to a radio-frequency signal may be ignored. In this case, the signal with the greatest interference may be suppressed to suppress local oscillator leakage. In a specific implementation, interference, to the radio-frequency signal, of a signal of each frequency in the local oscillator leakage signal outputted by the frequency mixer 04 may be analyzed by a spectrum analysis device or be manually analyzed, and the local oscillator signal adjustment path 01 generates the first signal based on an analysis result, to counterbalance the signal with the greatest interference. Based on this, the local oscillator signal adjustment path 01 can be simplified using the second possible implementation. In addition, optionally, the local oscillator signal adjustment path 01 may further include a frequency multiplier 011, to perform frequency adjustment on the signal inputted by the local oscillator signal adjustment path 01. Further, the input end Ti of the local oscillator signal adjustment path 01 may be coupled to the first local oscillator signal source 05, to receive the local oscillator signal LO1 from the first local oscillator signal source 05. The local oscillator signal LO1 sequentially passes through the frequency multiplier 011 for frequency adjustment, passes through the variable gain amplifier 012 for amplitude adjustment, and passes through the phase shifter PS2 for phase adjustment, to generate the first signal, where the first signal and the to-be-counterbalanced local oscillator leakage signal have a same frequency, a same amplitude, and opposite phases. FIG. 7B schematically shows a case in which an input end of the frequency multiplier 011 is coupled to the first local oscillator signal source 05, an output end of the frequency multiplier 011 is coupled to an input end of the variable gain amplifier 012, and an output end of the variable gain amplifier 012 is coupled to an input end of the phase shifter PS2, and an output end of the phase shifter PS2 is coupled to the first input end Ai1 of the adder 02. It should be noted that, positions of the frequency multiplier 011, the variable gain amplifier 012, and the phase shifter PS2 in the local oscillator signal adjustment path 01 are not limited in this embodiment of this disclosure. For example, the local oscillator signal LO1 inputted into the local oscillator signal adjustment path 01 may first pass through the variable gain amplifier 012 for amplitude adjustment, then pass through the frequency multiplier 011 for frequency adjustment, and finally pass through the phase shifter PS1 for phase adjustment, to finally generate the first signal.

FIG. 7B schematically shows a case in which the input end Ti of the local oscillator signal adjustment path 01 is coupled to the first local oscillator signal source 05 to input the local oscillator signal LO1. In another possible implementation, the input end Ti of the local oscillator signal adjustment path 01 may be further configured to input a random signal, and the local oscillator signal adjustment path 01 may further adjust the random signal to generate the first signal.

The local oscillator signal adjustment path 01 adjusts the local oscillator signal LO1 to generate the first signal without arranging another signal source, thereby reducing the circuit layout area. In addition, the first signal can be generated by simply adjusting the local oscillator signal LO1, thereby reducing complexity of generating the first signal.

In the phased array 100 shown in FIG. 4 to FIG. 6, the frequency mixer 04 is arranged on a signal input side of the adder 02. In another possible implementation, the frequency mixer 04 may be alternatively arranged on a signal output side of the adder 02. In this case, a schematic diagram of a structure of a phased array 100 is shown in FIG. 8.

Figure 8:
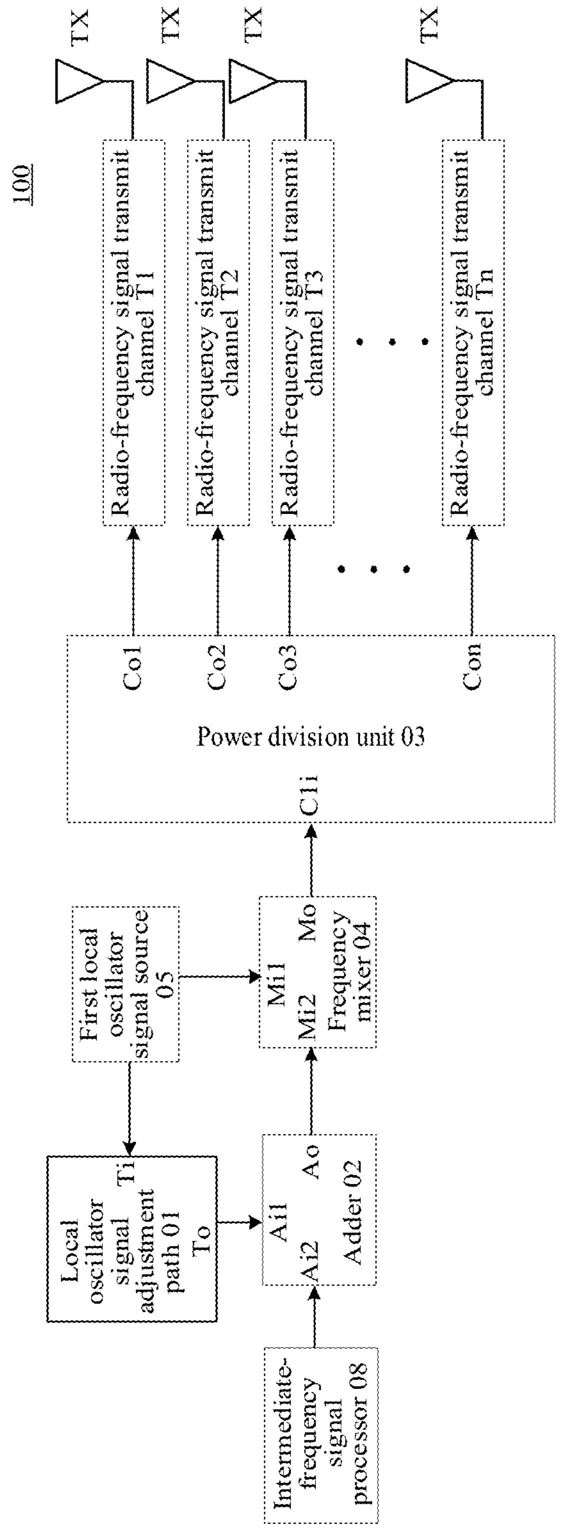
FIG. 8 is a schematic diagram of still another structure of a phased array according to an embodiment of this disclosure.

In FIG. 8, the phased array 100 includes a local oscillator signal adjustment path 01, an adder 02, a power division unit 03, a frequency mixer 04, an intermediate-frequency signal processor 08, and radio-frequency signal transmit channels T1, T2, T3, . . . , and Tn. Specific structures, components, and functions included in the local oscillator signal adjustment path 01, the power division unit 03, and the radio-frequency signal transmit channels T1, T2, T3, . . . , and Tn are the same as the specific structures, components, and functions included in the related units in the phased array 100 shown in FIG. 4 to FIG. 6. For details, refer to detailed descriptions of the related units in the embodiment shown in FIG. 4 to FIG. 6, which are not described herein again. Different from the phased array 100 shown in FIG. 4 to FIG. 6, in FIG. 8, an output end Mo of the frequency mixer 04 is coupled to an input end C1*i* of the power division unit 03, an input end Mi2 of the frequency mixer 04 is coupled to an output end Ao of the adder 02, and a second input end Ai2 of the adder 02 is coupled to the intermediate-frequency signal processor 08. The second input end Ai2 of the adder 02 is configured to receive an intermediate-frequency signal IF from the intermediate-frequency signal processor 08. A generation manner of the intermediate-frequency signal IF is the same as the generation manner of the intermediate-frequency signal IF in the embodiment shown in FIG. 4 to FIG. 6. Details are not described herein again. In addition, connection relationships among the remaining components and connection relationships between components and units in FIG. 8 are the same as the connection relationships among the components in the phased array 100 shown in FIG. 4 to FIG. 6. For details, refer to related descriptions in FIG. 4 to FIG. 6, which are not described herein again. It should be noted that, the phased array 100 shown in FIG. 8 includes one frequency mixer 04. In another possible implementation, the phased array 100 may alternatively include a plurality of frequency mixers. For example, the phased array 100 shown in FIG. 8 may alternatively include another frequency mixer. The frequency mixer may be arranged between the intermediate-frequency signal processor 08 and the adder 02, or may be arranged between the adder 02 and the frequency mixer 04. It may be understood that, when the phased array shown in FIG. 8 is provided with more frequency mixers, more local oscillator signal sources may be further arranged in the phased array. This case is not shown in the figure in this embodiment of this disclosure.

Figure 9:
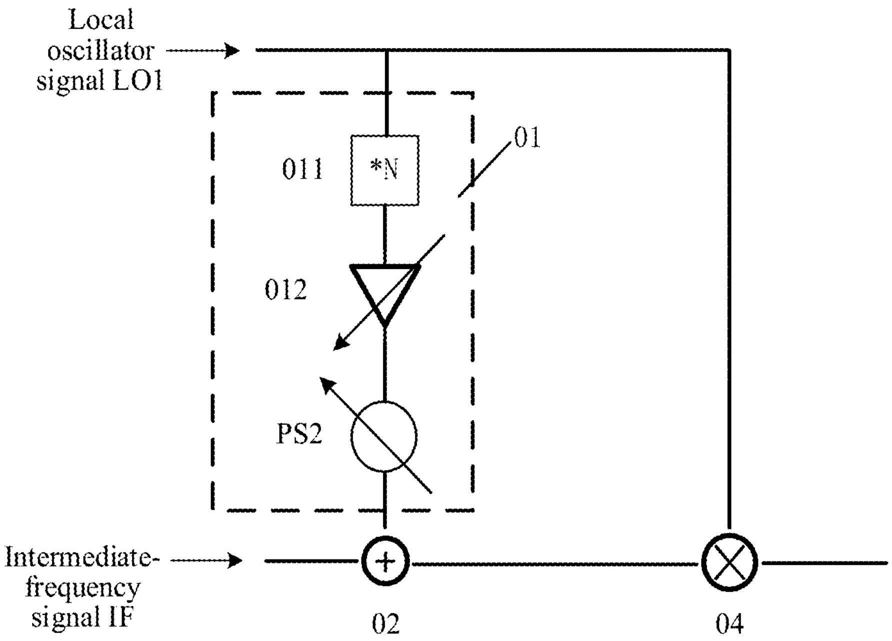
FIG. 9 is a schematic diagram of a local structure of the phased array shown in FIG. 8 according to an embodiment of this disclosure.

In the phased array 100 shown in FIG. 8, when the local oscillator signal adjustment path 01 is not arranged, signals outputted by the frequency mixer 04 further includes a local oscillator leakage signal in addition to a radio-frequency signal. In the phased array 100 shown in FIG. 8, the local oscillator signal adjustment path 01 is arranged to suppress local oscillator leakage of the phased array 100. The following uses a radio-frequency signal transmit channel of the phased array 100 as an example. With reference to FIG. 9, a principle of the phased array 100 in FIG. 8 suppressing the local oscillator leakage signal is described in detail. FIG. 9 shows a local circuit structure of the phased array 100 shown in FIG. 8. In FIG. 9, the local oscillator signal adjustment path 01 includes a frequency multiplier 011, a variable gain amplifier 012, and a phase shifter PS2. A local oscillator signal and harmonic signals of the local oscillator signal LO1 pass through the frequency multiplier 011, the variable gain amplifier 012, and the phase shifter PS2 in the local oscillator signal adjustment path 01 respectively for frequency adjustment, amplitude adjustment, and phase adjustment, and then a first signal is outputted. The first signal and the intermediate-frequency signal IF are superimposed by the adder 02 and then inputted into the frequency mixer 04. In this case, the first signal and the intermediate-frequency signal IF are respectively mixed with the local oscillator signal and the harmonic signals of the local oscillator signal in the frequency mixer. Signals mixed by the frequency mixer include the following types: a local oscillator leakage signal (the local oscillator leakage signal herein includes: the local oscillator signal LO1 inputted by the first input end of the frequency mixer 04), a radio-frequency signal generated by mixing the intermediate-frequency signal IF with the local oscillator signal LO1, and a signal (denoted as a third signal herein) generated by mixing the first signal with the local oscillator signal LO1. That is, in this case, the signal outputted by the frequency mixer 04 is the local oscillator leakage signal+the radio-frequency signal+the third signal. Therefore, when the frequency multiplier 011, the variable gain amplifier 012, and the phase shifter PS2 in the local oscillator signal adjustment path 01 are adjusted, the third signal counterbalances the local oscillator leakage signal (the local oscillator signal or the harmonic signals of the local oscillator signal), so that the signal outputted by the frequency mixer 04 includes only the radio-frequency signal. For example, when the third signal and the local oscillator leakage signal have a same frequency, a same amplitude, and opposite phases (in other words, a phase difference is 180 degrees), the third signal can counterbalance the local oscillator leakage signal.

The following uses a specific example for a more detailed description. It is assumed that the local oscillator signal and the harmonic signals of the local oscillator signal LO1 that are outputted by the first local oscillator signal source 05 are $\cos(2\pi mF^*t+\Phi)$, and m is a positive integer. After the local oscillator signal and the harmonic signals of the local oscillator signal LO1 pass through the frequency multiplier 011, the variable gain amplifier 012, and the phase shifter PS2 in the local oscillator signal adjustment path 01 respectively for frequency adjustment, amplitude adjustment, and phase adjustment, the outputted first signal is $\cos(2\pi nF^*t+\theta)$, and n is a positive integer. The third signal generated by mixing the first signal with the local oscillator signal includes at least: $A=\cos[2\pi(n+m)F^*t+\theta+\Phi]$ and $B=\cos[2\pi(m-n)F^*t+\Phi-\theta]$. In this case, the local oscillator leakage signal includes: $\cos(2\pi^*mF^*t+\Phi)$. It is assumed that in the local oscillator leakage signal, a signal that has greatest interference to the radio-frequency signal is $\cos(2\pi F^*t+\Phi)$ or $\cos(2\pi^*3F^*t+\Phi)$. In addition, when $n+m=3$, $n-m=1$, $\theta+\Phi=\Phi+\pi$, and $\Phi-\theta=\Phi+\pi$, that is, when $n=2$, $m=1$, and $\theta=2\Phi$, the signal A in the third signal counterbalances $\cos(2\pi^*F^*t+\Phi)$ in the local oscillator leakage signal, and the signal B in the third signal counterbalances $\cos(2\pi^*3F^*t+\Phi)$ in the local oscillator leakage signal. In this way, the interference of the local oscillator leakage signal to the radio-frequency signal is reduced.

Figure 10:
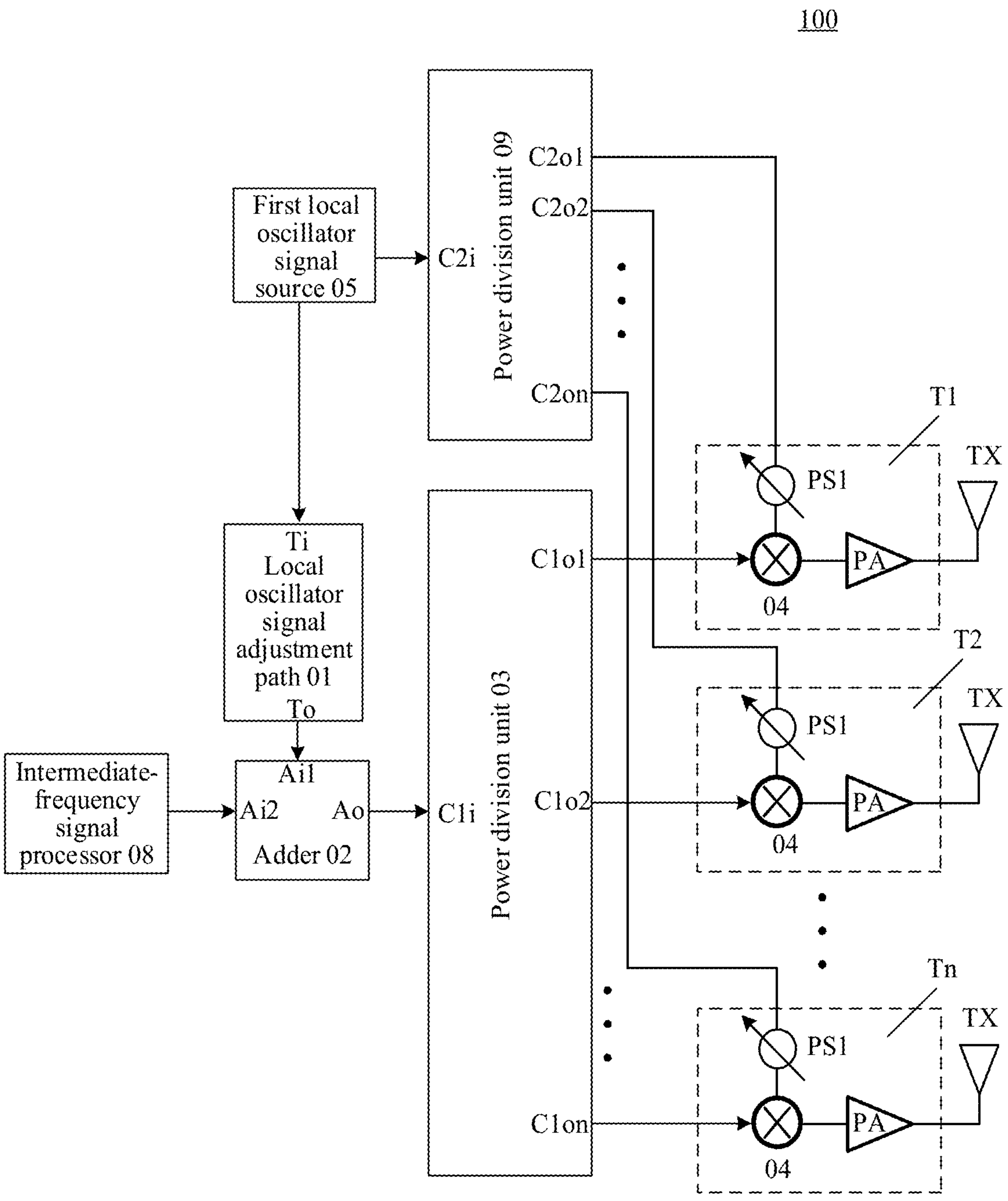
FIG. 10 is a schematic diagram of still another structure of a phased array according to an embodiment of this disclosure.

It can be learned from FIG. 4, FIG. 5, FIG. 6, and FIG. 8 that, in the phased arrays 100 shown in FIG. 4, FIG. 5, FIG. 6, and FIG. 8, the frequency mixer 04 is arranged on a signal input side of the power division unit 03. In a possible implementation, the frequency mixer 04 may alternatively be arranged on a signal output side of the power division unit 03. In this case, the phased array 100 may include a plurality of frequency mixers 04, that is, each radio-frequency signal transmit channel is provided with a frequency mixer 04. For details, refer to FIG. 10. FIG. 10 is a schematic diagram of still another structure of a phased array 100 according to an embodiment of this disclosure.

Figure 11A:
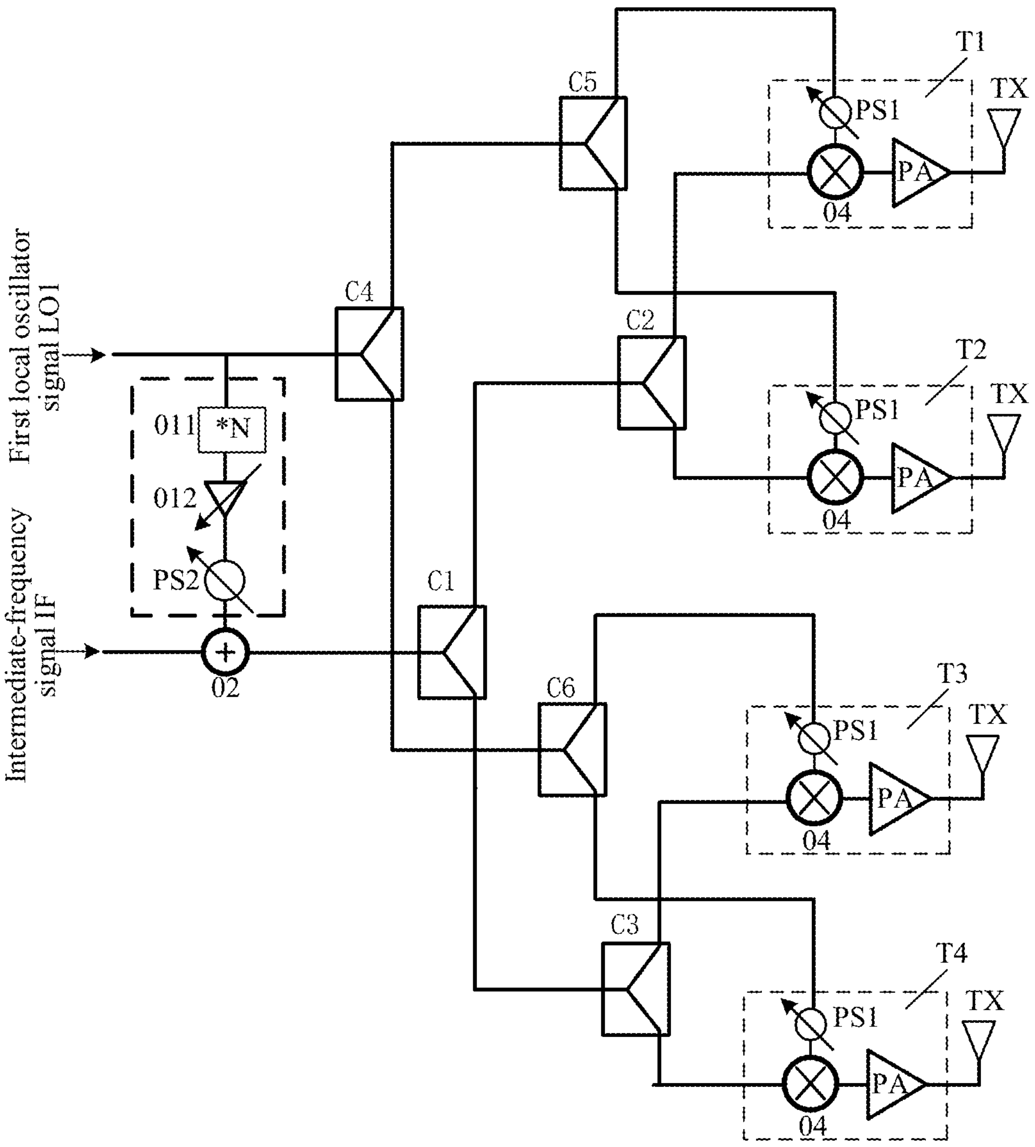
FIG. 11A is a schematic diagram of a specific structure of the phased array shown in FIG. 10 according to an embodiment of this disclosure.
Figure 11B:
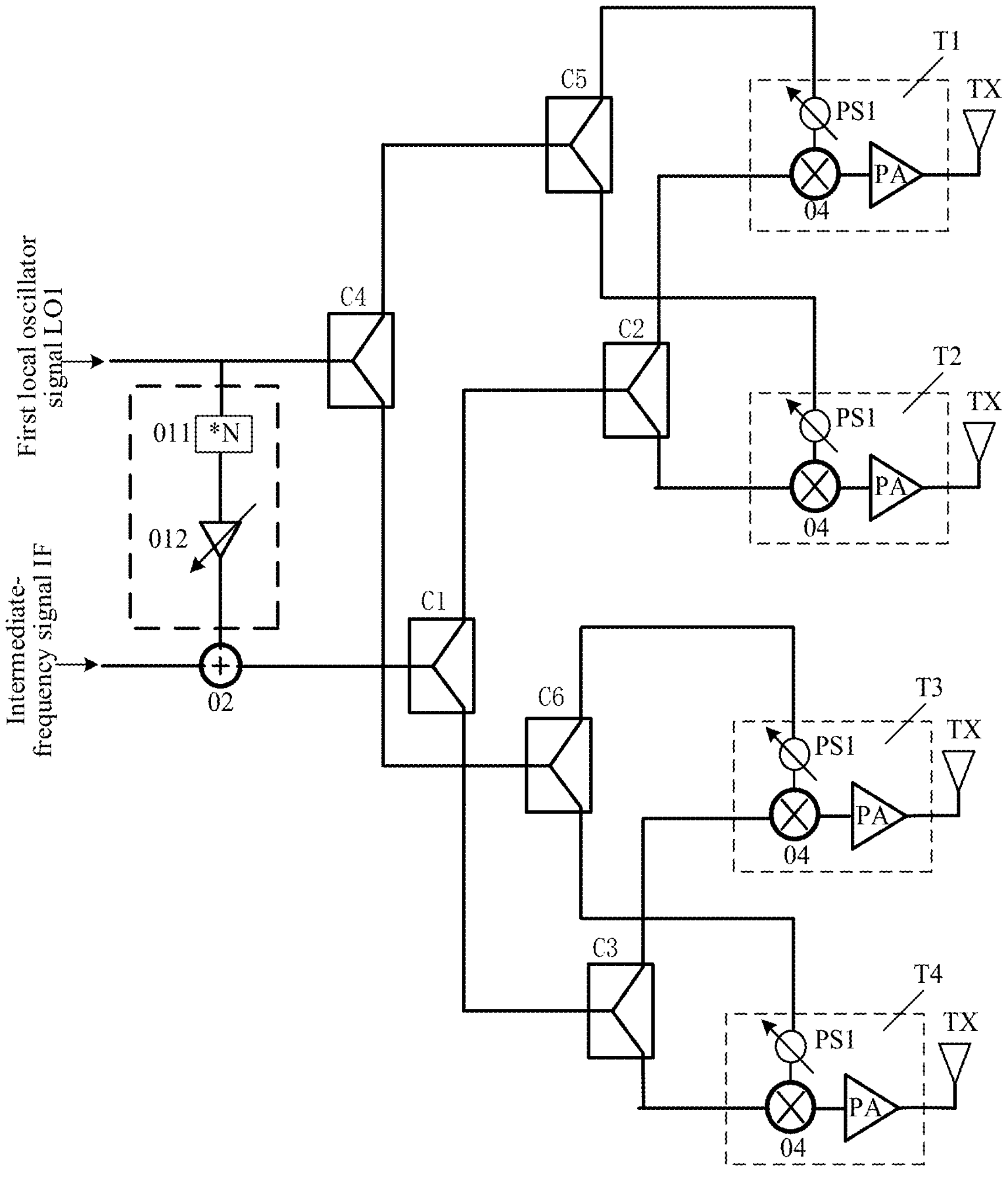
FIG. 11B is a schematic diagram of another specific structure of the phased array shown in FIG. 10 according to an embodiment of this disclosure.

In FIG. 10, the phased array 100 includes a local oscillator signal adjustment path 01, an adder 02, a power division unit 03, an intermediate-frequency signal processor 08, and radio-frequency signal transmit channels T1, T2, . . . , and Tn. Different from the foregoing embodiments, the phased array 100 further includes a power division unit 09. In addition, each radio-frequency signal transmit channel of the radio-frequency signal transmit channels T1, T2, Tn includes a frequency mixer 04. The power division unit 09 includes at least one power divider. An input end C2*i* of the power division unit 09 is coupled to a first local oscillator signal source 05, and each of a plurality of output ends C2*o*1, C2*o*2, . . . , C2*on* of the power division unit 09 is coupled to a first input end of each frequency mixer 04 of the plurality of frequency mixers 04 in a one-to-one correspondence. An input end C1*i* of the power division unit 03 is coupled to an output end Ao of the adder 02, and each of a plurality of output ends C1*o*1, C1*o*2, . . . , C1*on* of the power division unit 03 is coupled to a second input end of each frequency mixer 04 of the plurality of frequency mixers 04 in a one-to-one correspondence. A specific structure of the power division unit 03 is the same as the structure of the power division unit 03 shown in FIG. 4. Details are not described herein again. In addition to the frequency mixer, the radio-frequency signal transmit channels T1, T2, . . . , and Tn may further include a power amplifier PA and a phase shifter PS1. An output end of the frequency mixer 04 is coupled to an input end of the power amplifier PA, and an output end of the power amplifier PA is coupled to an antenna TX. The phase shifter PS1 may be arranged on a signal input side of the frequency mixer 04, or may be arranged on a signal output side of the frequency mixer 04. In other words, in a possible implementation, one output end of the power division unit 09 is coupled to the first input end of the frequency mixer 04 through the phase shifter PS1. In another possible implementation, the output end of the frequency mixer 04 is coupled to the input end of the power amplifier PA through the phase shifter PS1. FIG. 10 shows a case in which the phase shifter PS1 is arranged on the signal input side of the frequency mixer 04. An input end Ti of the local oscillator signal adjustment path 01 is coupled to the first local oscillator signal source 05, and an output end To is coupled to a first input end Ai1 of the adder 02, and is configured to input a first signal to the adder 02. A second input end Ai2 of the adder 02 is coupled to the intermediate-frequency signal processor 08, and is configured to receive an intermediate-frequency signal IF from the intermediate-frequency signal processor 08. A specific generation manner of the intermediate-frequency signal IF is the same as the generation manner of the intermediate-frequency signal IF described in FIG. 4. Details are not described herein again. The local oscillator signal adjustment path 01 may be various types of structures. In a first possible implementation, the local oscillator signal adjustment path 01 may be the structure shown in FIG. 7A. In a second possible implementation, the local oscillator signal adjustment path 01 may alternatively be the structure shown in FIG. 7B. In a third possible implementation, the local oscillator signal adjustment path 01 may not require a phase shifter, and may include only a variable gain amplifier, or may include a frequency multiplier and a variable gain amplifier. In this case, phase adjustment is implemented by the phase shifter PS1 in each radio-frequency signal transmit channel. The phase shifters PS1 in the radio-frequency signal transmit channels T1, T2, . . . , and Tn may be simultaneously adjusted, so that the phase shifters PS1 in the radio-frequency signal transmit channels are first uniformly shifted to a fixed phase P1. The fixed phase P1 is based on a phase difference between a local oscillator signal and the first signal. Based on this, the phase shifter PS1 in each radio-frequency signal transmit channel may be continuously adjusted based on a principle of the phased array transmitting a signal as shown in FIG. 3, so that the phased array transmits a beamformed signal. In this way, the local oscillator signal leaking from the frequency mixer 04 can be also suppressed. Based on the second possible implementation, refer to FIG. 11A. FIG. 11A is a schematic diagram of a specific structure of the phased array 100 shown in FIG. 10. FIG. 11A schematically shows a case in which there are four radio-frequency signal transmit channels T1, T2, T3, and T4, the power division unit 03 includes three power dividers C1, C2, and C3, the power division unit 09 includes three power dividers C4, C5, and C6, and the local oscillator signal adjustment path 01 includes a frequency multiplier 011, a variable gain amplifier 012, and a phase shifter PS2. Based on the third possible implementation, refer to FIG. 11B. FIG. 11B is a schematic diagram of another specific structure of the phased array 100 shown in FIG. 10. FIG. 11B schematically shows a case in which the local oscillator signal adjustment path 01 includes the frequency multiplier 011 and the variable gain amplifier 012. The remaining components are the same as the components shown in FIG. 11A. Details are not described again.

A principle of suppressing the local oscillator leakage signal in the phased array 100 shown in FIG. 10 to FIG. 11B is the same as the principle of suppressing the local oscillator leakage signal in the phased array 100 shown in FIG. 8. For details, refer to related descriptions in the embodiment shown in FIG. 8, which are not described herein again.

It can be learned from FIG. 10 to FIG. 11B that, in the phased array 100 shown in FIG. 10, FIG. 11A, and FIG. 11B, the local oscillator signal adjustment path 01 is arranged on signal input sides of the power division unit 03 and the power division unit 09. Compared with the solution of suppressing the local oscillator signal in a traditional phased array, the local oscillator leakage signal can be effectively suppressed while reducing power consumption and a layout area.

Figure 12:
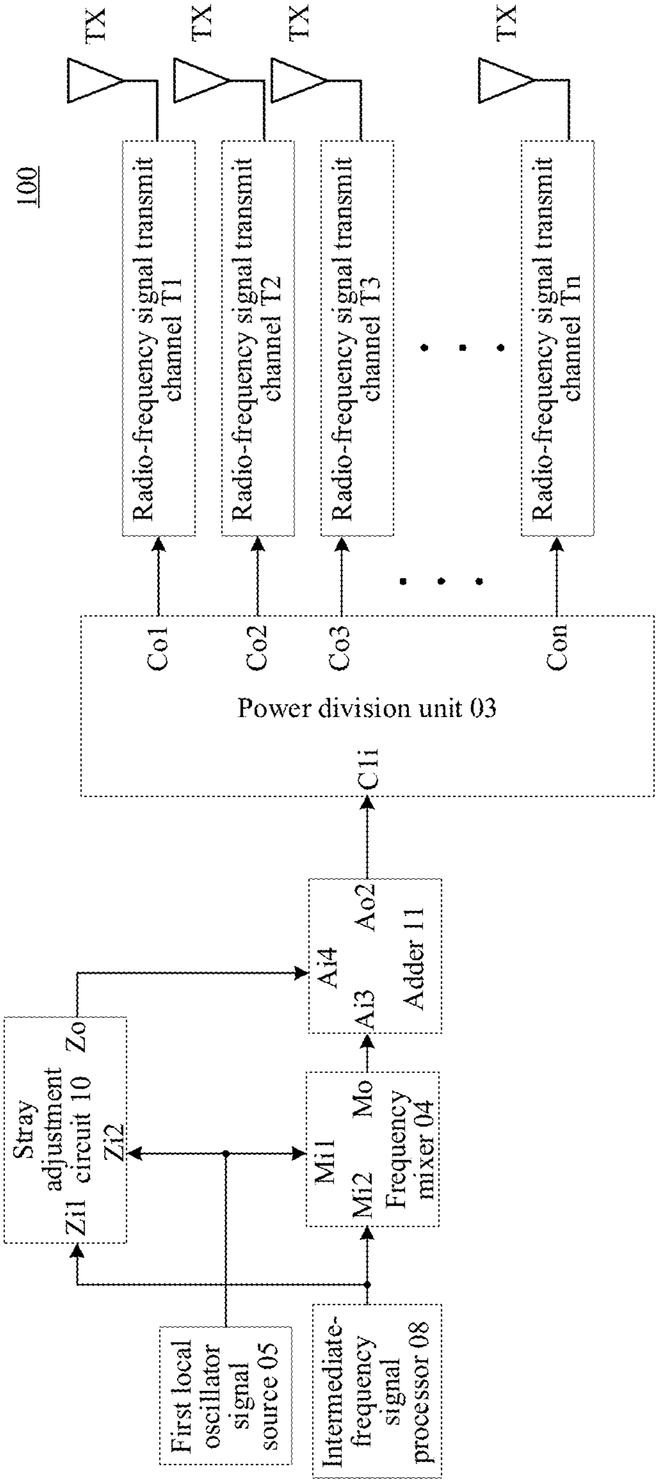
FIG. 12 is a schematic diagram of still another structure of a phased array according to an embodiment of this disclosure.

In the phased arrays 100 shown in FIG. 4 to FIG. 11B, the local oscillator signal adjustment path 01 is arranged to suppress the local oscillator leakage signal. Generally, because the local oscillator signal is introduced into the phased array 100, a stray emission related to the local oscillator signal is inevitably introduced into the phased array 100. After being amplified by the power amplifier PA at a front end of the phased array 100, the stray emission is radiated to free space, causing interference to a signal received by a receive end. To suppress the stray emission in the phased array 100, an embodiment of this disclosure further provides a phased array 100 shown in FIG. 12. In FIG. 12, different from the foregoing embodiments, the phased array 100 is not provided with a local oscillator signal adjustment path 01 and an adder 02, and the phased array 100 includes a stray adjustment circuit 10 and an adder 11. An input end Zi1 of the stray adjustment circuit 10 is coupled to an output end of an intermediate-frequency signal processor 08, and is configured to input an intermediate-frequency signal IF. An input end Zi2 of the stray adjustment circuit 10 is coupled to a first local oscillator signal source 05, and an output end Zo of the stray adjustment circuit 10 is coupled to an input end Ai4 of the adder 11. An output end Mo of a frequency mixer 04 is coupled to an input end Ai3 of the adder 11, and an output end Ao2 of the adder 11 is coupled to an input end C1*i* of a power division unit 03. In addition, structures of the intermediate-frequency signal processor 08, the first local oscillator signal source 05, the frequency mixer 04, the power division unit 03, and radio-frequency signal transmit channels T1, T2, T3, . . . , and Tn in the phased array 100 shown in FIG. 12 are the same as the structures of the intermediate-frequency signal processor 08, the first local oscillator signal source 05, the frequency mixer 04, the power division unit 03, and the radio-frequency signal transmit channels in FIG. 4 or FIG. 8. Details are not described again. In FIG. 12, the stray adjustment circuit 10 is configured to receive the intermediate-frequency signal IF from the intermediate-frequency signal processor 08, and receive a local oscillator signal LO from the first local oscillator signal source 05. After performing phase shift on the received local oscillator signal LO, the stray adjustment circuit 10 mixes the received local oscillator signal LO with the intermediate-frequency signal IF, and outputs a generated signal to the adder 11. In addition, the frequency mixer 04 receives the intermediate-frequency signal IF from the intermediate-frequency signal processor 08 and receives the local oscillator signal LO from the first local oscillator signal source 05. After mixing the intermediate-frequency signal IF and the local oscillator signal LO, the frequency mixer 04 outputs a generated signal to the adder 11. The adder 11 superimposes the signal outputted by the stray adjustment circuit 10 on the signal outputted by the frequency mixer 04, generates a superimposed signal, and outputs the signal to the input end C1*i* of the power division unit 03.

In this embodiment of this disclosure, by arranging the stray adjustment circuit 10, phase shift can be performed on the local oscillator signal LO based on a frequency of a to-be-outputted signal and a frequency of a stray signal. In this way, a phase of a stray signal outputted by the stray adjustment circuit 10 is opposite to a phase of a stray signal outputted by the frequency mixer 04 (in other words, a phase difference is 180 degrees), so that the stray signal outputted by the stray adjustment circuit 10 counterbalances the stray signal outputted by the frequency mixer 04, thereby suppressing the stray emission and avoiding interference caused by the stray emission to a signal received by a receive end.

Figure 13A:
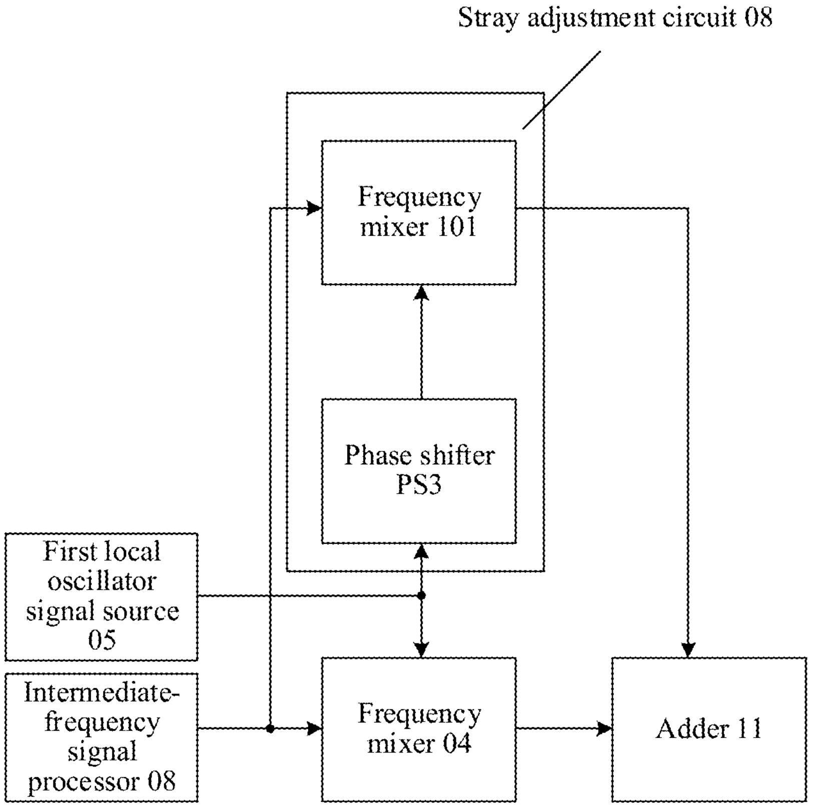
FIG. 13A is a schematic diagram of a structure of a stray adjustment circuit according to an embodiment of this disclosure.
Figure 13B:
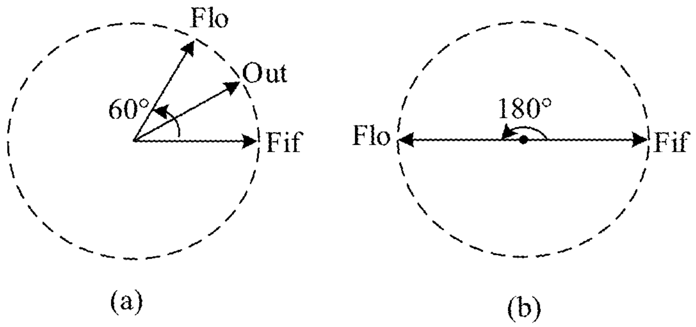
FIG. 13B is a phase vector diagram of a signal outputted by the stray adjustment circuit shown in FIG. 13A according to an embodiment of this disclosure.

Based on the phased array 100 shown in FIG. 12, the stray adjustment circuit 10 may be implemented in a plurality of manners in this embodiment of this disclosure. In a first possible implementation, the stray adjustment circuit 10 includes a frequency mixer 101 and a phase shifter PS3, as shown in FIG. 13A. The first local oscillator signal source 05 is coupled to one input end of the frequency mixer 101 through the phase shifter PS3. The other input end of the frequency mixer 101 is coupled to an input end of the intermediate-frequency signal processor 08. An output end of the frequency mixer 101 is coupled to the output end Ai4 of the adder. Based on the stray adjustment circuit 10 shown in FIG. 13A and with reference to a signal phase diagram shown in FIG. 13B, an overall principle of suppressing the stray emission in this embodiment of this disclosure is described. In FIG. 13B, Fif is a signal outputted by the frequency mixer 04, flo is a signal outputted by the frequency mixer 101, and out is a signal obtained after the adder 11 superimposes the signal Fif on the signal flo. It is assumed that a signal that needs to be outputted by the phased array 100 is Flo+Fif, and a stray signal that needs to be suppressed is 3Flo−Fif, where Flo is a signal whose phase is adjusted by 60 degrees. (a) in FIG. 13B is a phase vector diagram of the signal outputted by the adder 11, and (b) in FIG. 13B is a vector diagram obtained after superimposing the stray signal outputted by the frequency mixer 101 on the stray signal outputted by the frequency mixer 04. It can be seen from FIG. 13B that, by arranging the frequency mixer 101 and the phase shifter PS3, a to-be-transmitted signal may be obtained by superimposing the signals outputted by the frequency mixer 101 and the frequency mixer 04. The stray signal outputted by the frequency mixer 101 counterbalances the stray signal outputted by the frequency mixer 04, thereby suppressing the stray signal.

Figure 13C:
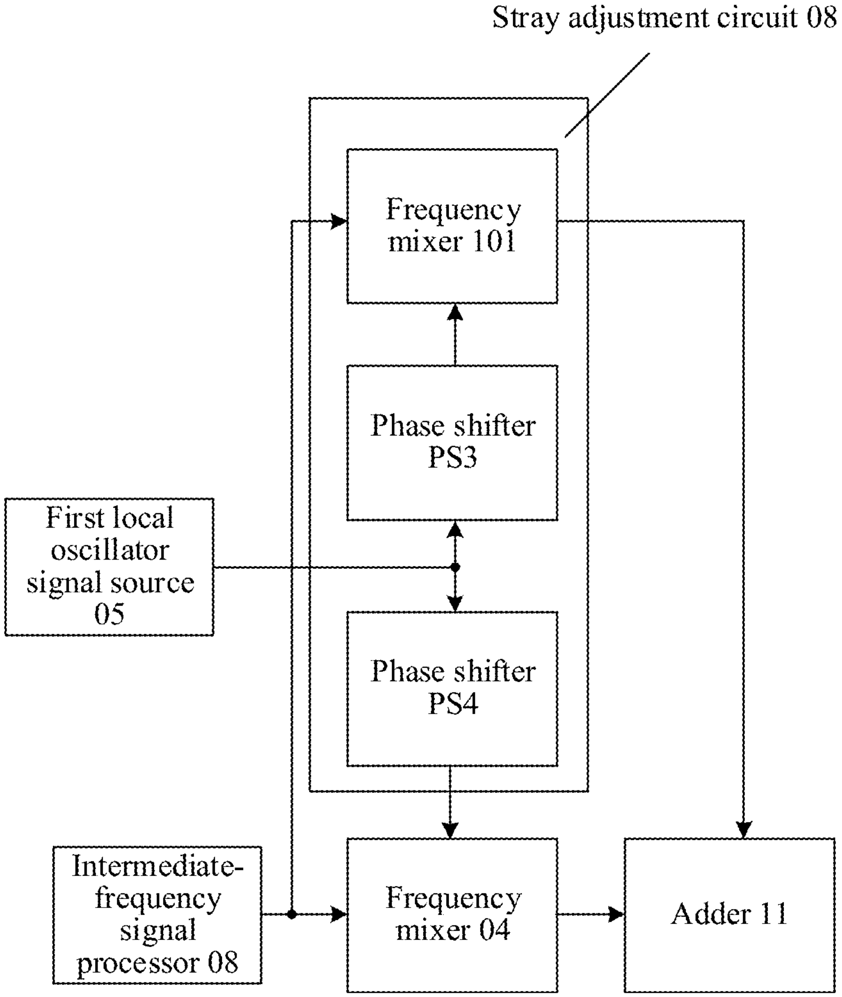
FIG. 13C is a schematic diagram of another structure of a stray adjustment circuit according to an embodiment of this disclosure.

The stray adjustment circuit 10 shown in FIG. 13A includes the frequency mixer 101 and the phase shifter PS3. In a second possible implementation, to make it easier to adjust the signals outputted by the frequency mixer 101 and the frequency mixer 04, on the basis of the stray adjustment circuit 10 shown in FIG. 13A, the stray adjustment circuit 10 further includes a phase shifter PS4, as shown in FIG. 13C. An output end of the first local oscillator signal source 05 is coupled to an input end Mi1 of the frequency mixer 04 through the phase shifter PS4. By arranging the phase shifter PS4, phases of the phase shifter PS3 and the phase shifter PS4 can be simultaneously adjusted, and the to-be-transmitted signal may also be obtained by superimposing the signals outputted by the frequency mixer 101 and the frequency mixer 04. The stray signal outputted by the frequency mixer 101 counterbalances the stray signal outputted by the frequency mixer 04, thereby suppressing the stray signal.

Figure 14:
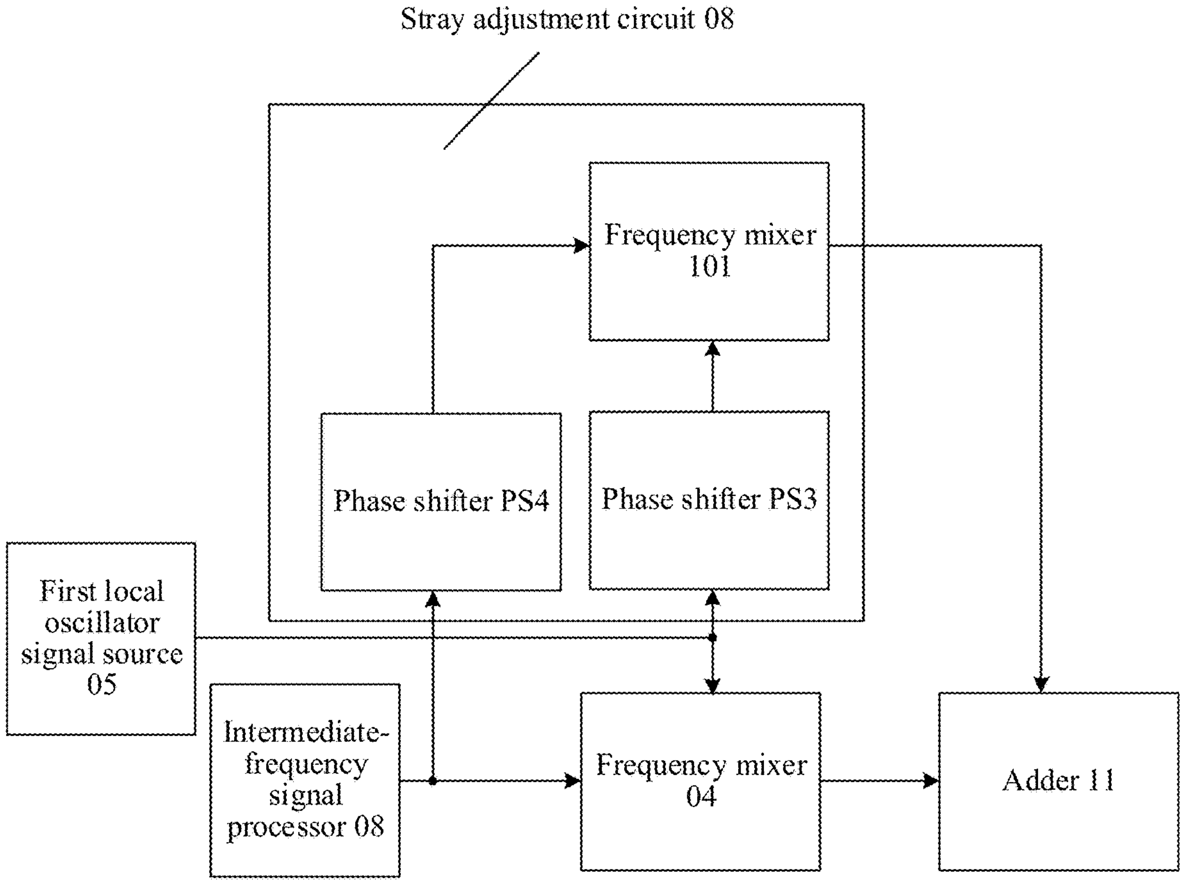
FIG. 14 is a schematic diagram of still another structure of a stray adjustment circuit according to an embodiment of this disclosure.

In the stray adjustment circuit 10 shown in FIG. 13A and FIG. 13C, the stray signal is suppressed by performing phase shift on the local oscillator signal. In this embodiment of this disclosure, in addition to performing phase shift on the local oscillator signal, phase shift may further be performed on the intermediate-frequency signal to suppress the stray signal. In a third possible implementation, based on the stray adjustment circuit 10 shown in FIG. 13A, the stray adjustment circuit 10 further includes the phase shifter PS4, as shown in FIG. 14. The phase shifter PS4 is arranged between the intermediate-frequency signal processor 08 and the frequency mixer 101. The signal outputted by the intermediate-frequency signal processor 08 is outputted to the frequency mixer 101 after being phase-shifted by the phase shifter PS4. In this way, phases of the phase shifter PS3 and the phase shifter PS4 are adjusted, so that a to-be-transmitted signal outputted by the frequency mixer 101 and a to-be-transmitted signal outputted by the frequency mixer 04 can have a same phase, and the stray signal outputted by the frequency mixer 101 and the stray signal outputted by the frequency mixer 04 have opposite phases, thereby suppressing the stray signal. For example, it is assumed that a signal that needs to be outputted by the phased array 100 is Flo+Fif, and a stray signal that needs to be suppressed is 3Flo−Fif, a phase of the phase shifter PS4 is set to −45°, and a phase of the phase shifter PS3 is set to 45°. The intermediate-frequency signal IF is −45° after being phase-shifted by the phase shifter PS4, and the local oscillator signal LO is 45° after being phase shifted by the phase shifter PS3. After the frequency mixer mixes the phase-shifted intermediate-frequency signal IF with the phase-shifted local oscillator signal LO, a phase of an obtained to-be-transmitted signal Flo is the same as a phase of the signal Fif outputted by the frequency mixer 04, and a phase of an obtained stray signal 3Flo is opposite to the phase of the signal Fif outputted by the frequency mixer 04, that is, the stray signal is counterbalanced, thereby suppressing the stray signal.

Figure 15:
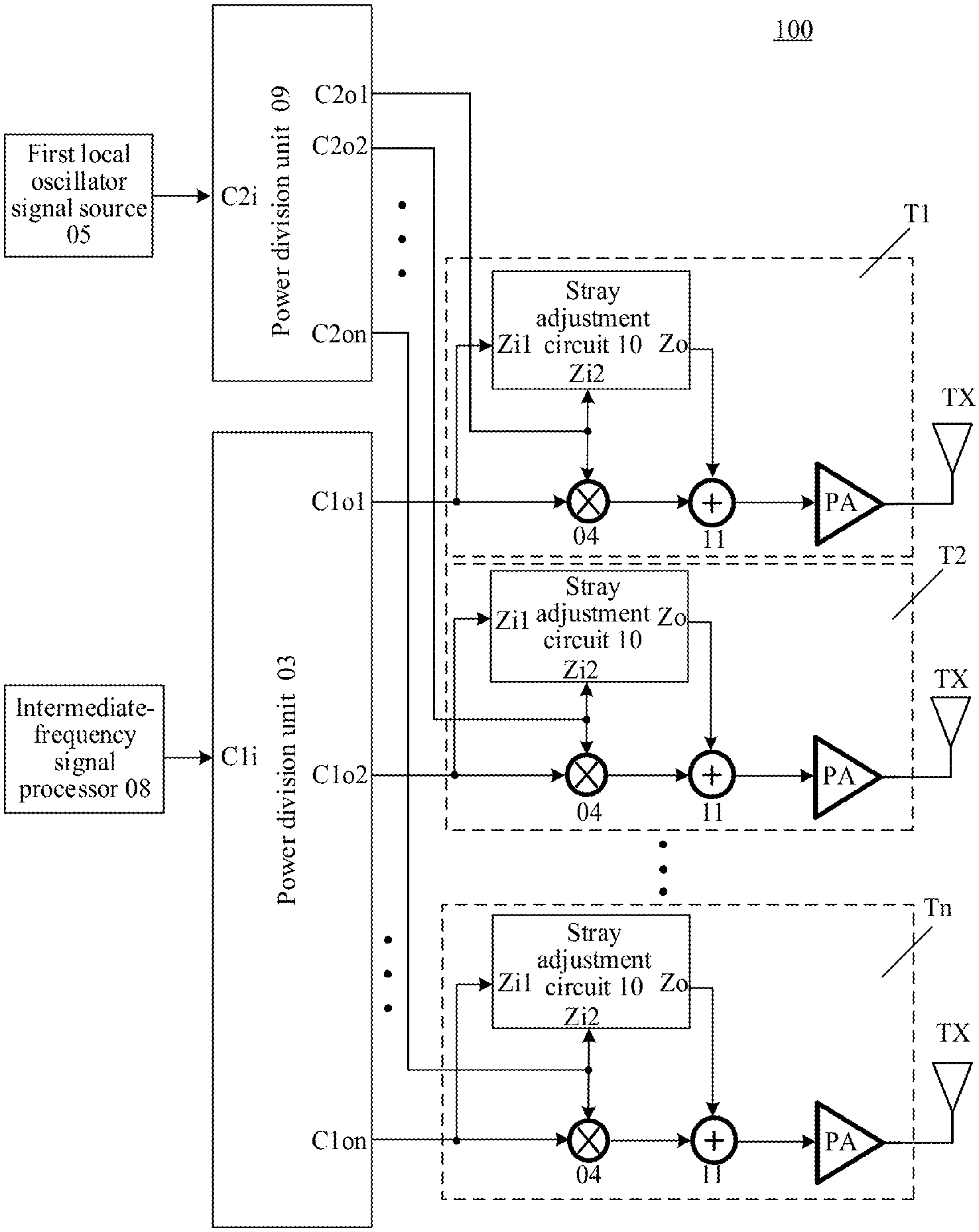
FIG. 15 is a schematic diagram of still another structure of a phased array according to an embodiment of this disclosure.
Figure 16:
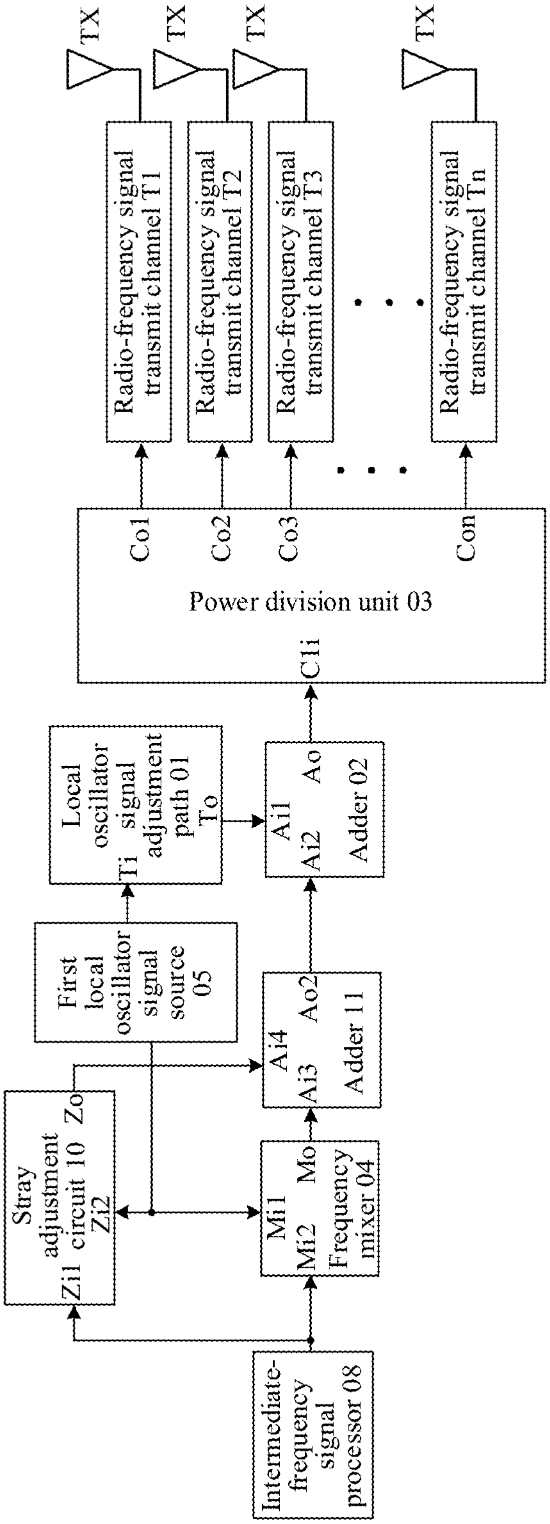
FIG. 16 is a schematic diagram of still another structure of a phased array according to an embodiment of this disclosure.
Figure 17:
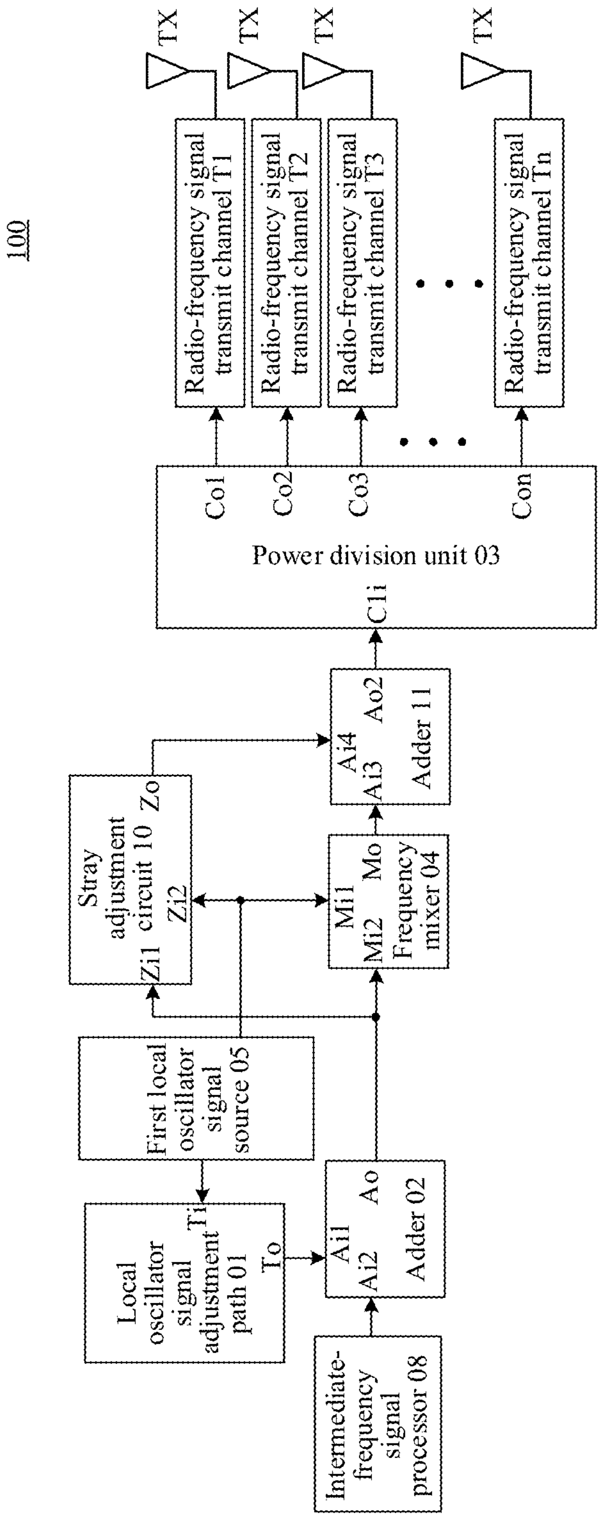
FIG. 17 is a schematic diagram of still another structure of a phased array according to an embodiment of this disclosure.
Figure 18:
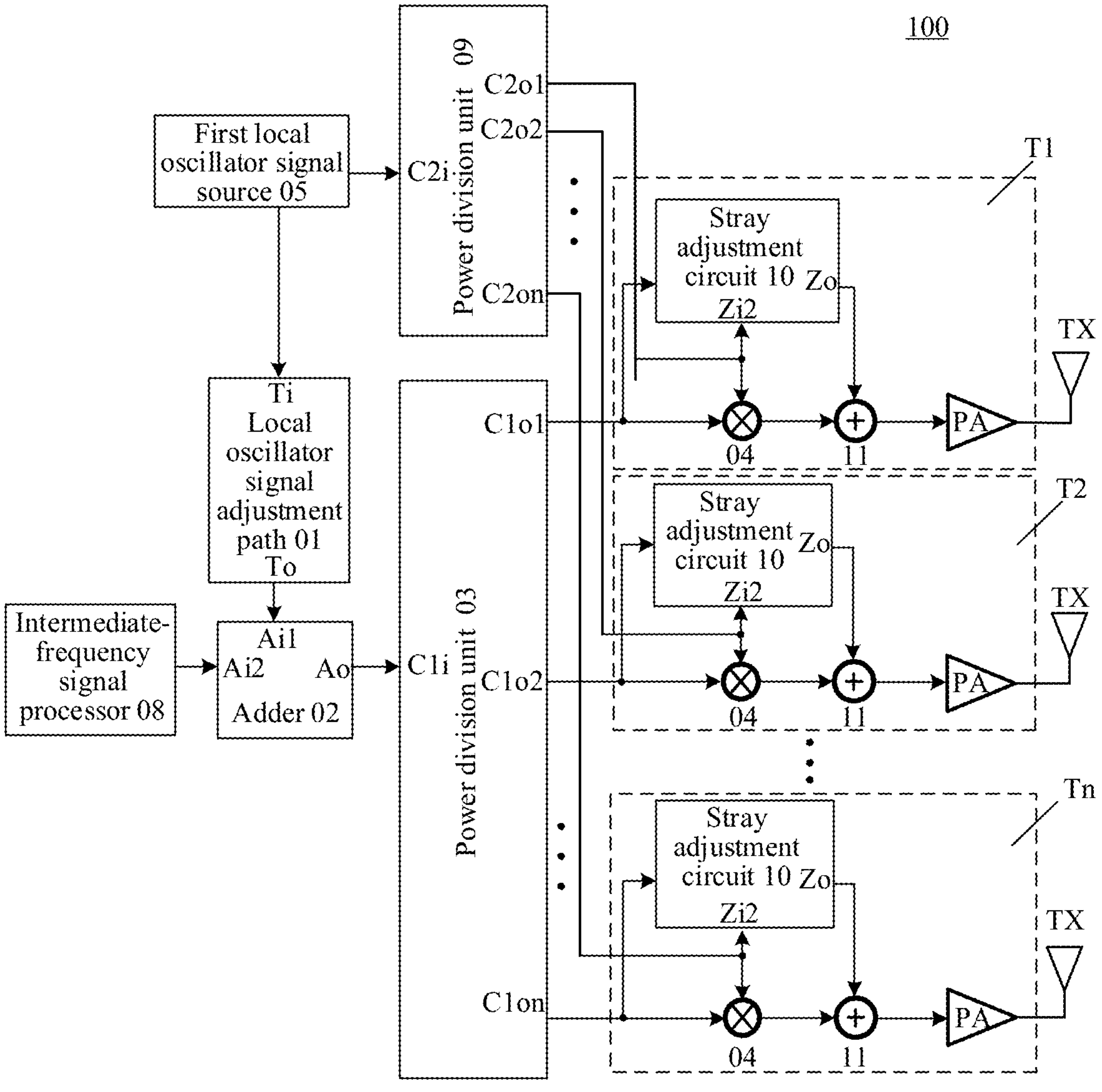
FIG. 18 is a schematic diagram of still another structure of a phased array according to an embodiment of this disclosure.

In the phased array 100 shown in FIG. 12, the frequency mixer 04 is arranged on an input side of the power division unit 03. In another possible implementation, the frequency mixer 04 may be arranged on an output side of the power division unit 03, that is, each radio-frequency signal transmit channel is provided with a frequency mixer 04. In this implementation, each radio-frequency signal transmit channel may be provided with a stray adjustment circuit 10, as shown in FIG. 15. FIG. 15 is a schematic diagram of still another structure of a phased array 100 according to an embodiment of this disclosure. In FIG. 15, the phased array 100 includes an intermediate-frequency signal processor 08, a first local oscillator signal source 05, a power division unit 03, a power division unit 09, and radio-frequency signal transmit channels T1, T2, . . . , and Tn. Structures of the power division unit 03 and the power division unit 09 are the same as the structures of the power division unit 03 and the power division unit 09 shown in FIG. 10. The first local oscillator signal source 05 is coupled to an input end C2*i* of the power division unit 09, to input a local oscillator signal to the power division unit 09. The intermediate-frequency signal processor 08 is coupled to an input end C1*i* of the power division unit 03, to input a local oscillator signal to the power division unit 03. Each radio-frequency signal transmit channel shown in FIG. 15 includes a stray adjustment circuit 10, a frequency mixer 04, an adder 11, and a power amplifier PA. A structure of the stray adjustment circuit 10 in each radio-frequency signal transmit channel may be any one in FIG. 13A, FIG. 13C, or FIG. 14. A specific working principle is not described in detail again. A coupling relationship among the stray adjustment circuit 10, the frequency mixer 04, and the adder 11 is the same as the coupling relationship among the stray adjustment circuit 10, the frequency mixer 04, and the adder 11 shown in FIG. 12. For details, refer to related descriptions, which are not described again. An output end of the adder 11 is coupled to an input end of the power amplifier PA, to input a to-be-transmitted signal to the power amplifier PA. The power amplifier PA performs power amplification on the to-be-transmitted signal, and then transmits the signal through an antenna TX. The phased arrays 100 shown in FIG. 12 and FIG. 15 show a case in which the phased array 100 is provided with the stray adjustment circuit 10. In another possible implementation, both the local oscillator signal adjustment circuit 01 and the stray adjustment circuit 10 may be arranged in the phased array 100, so that both local oscillator leakage and stray emission can be suppressed in the phased array 100. In this embodiment of this disclosure, on the basis of the phased arrays 100 shown in FIG. 4, FIG. 5, FIG. 6, FIG. 8, FIG. 10, FIG. 11A, and FIG. 11B, the stray adjustment circuit 10 may be further arranged. For example, on the basis of the phased array 100 shown in FIG. 4, the stray adjustment circuit 10 and the adder 11 are further arranged, as shown in FIG. 16. The adder 11 is arranged between the output end Mo of the frequency mixer 04 and the input end Ai2 of the adder 02. For a coupling relationship among the stray adjustment circuit 10, the frequency mixer 04, and the adder 11, refer to FIG. 12. For specific structures, connection relationships, and working principles of the remaining components, refer to the descriptions of the components shown in FIG. 4. Details are not described again. For another example, on the basis of the phased array 100 shown in FIG. 8, the stray adjustment circuit 10 and the adder 11 are further arranged, as shown in FIG. 17. The input end Ai2 of the adder 02 is coupled to the output end of the intermediate-frequency signal processor 08, and the output end Ao of the adder 02 is coupled to the input end Mi2 of the frequency mixer 04 and an input end Zi of the stray adjustment circuit 10. For a coupling relationship among the stray adjustment circuit 10, the frequency mixer 04, and the adder 11, refer to FIG. 12. For specific structures, connection relationships, and working principles of the remaining components, refer to the descriptions of the components shown in FIG. 4. Details are not described again. For still another example, on the basis of the phased array 100 shown in FIG. 10, each radio-frequency signal transmit channel may be further provided with the stray adjustment circuit 10 and the adder 11, as shown in FIG. 18. In the phased array 100 shown in FIG. 17, structures of radio-frequency signal transmit channels T1, T2, . . . , and Tn are the same as the structures of the radio-frequency signal transmit channels T1, T2, . . . , and Tn shown in FIG. 15. For details, refer to related descriptions in FIG. 15. Structures, connection relationships, and working principles of the remaining components are the same as those of the related components shown in FIG. 10. For details, refer to descriptions of the related components in FIG. 10, which are not described again.

Figure 19:
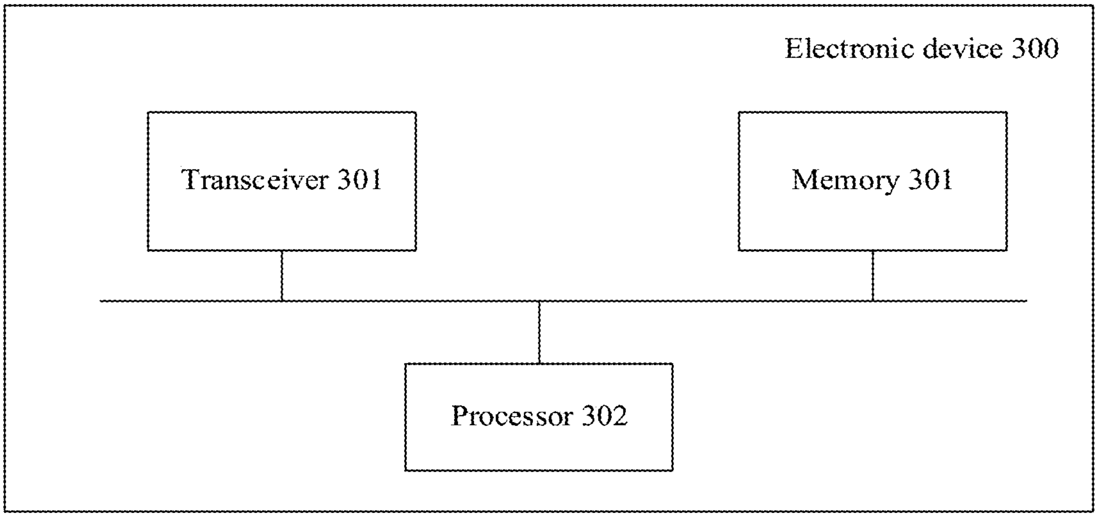
FIG. 19 is a schematic diagram of a structure of an electronic device according to an embodiment of this disclosure.

An embodiment of this disclosure further provides an electronic device 300. Refer to FIG. 19, the electronic device 300 may include a transceiver 301, a memory 302, and a processor 303. The foregoing phased array 100 described in the foregoing embodiments is arranged inside the transceiver 301. The first local oscillator signal source 05 and the second local oscillator signal source 07 described in the foregoing embodiments may be arranged in the processor 303 to generate a local oscillator signal LO1 and a local oscillator signal LO2. In addition, an intermediate-frequency signal processor 08 may be further arranged in the processor 303 to generate an intermediate-frequency signal and the like.

Figure 20:
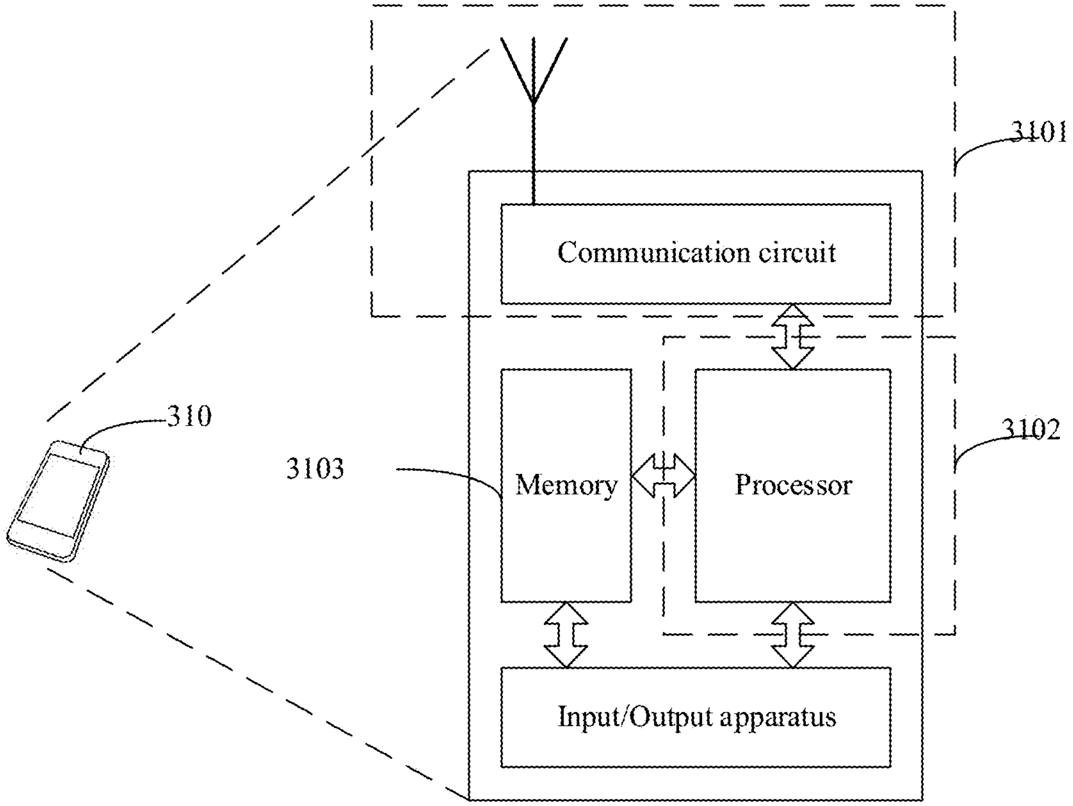
FIG. 20 is a schematic diagram of a structure of a terminal device according to an embodiment of this disclosure.

It should be understood that, the electronic device 300 herein may be a terminal device such as a smartphone, a computer, or a smartwatch. A smartphone 310 shown in FIG. 20 is used as an example of the terminal device. The smartphone may include a processor 3102, a memory 3103, a communication circuit, an antenna, and an input/output apparatus. The processor 3102 is mainly configured to process a communication protocol and communication data, control the entire smartphone, execute a software program, and process data of the software program, for example, configured to support the smartphone 310 in performing various communication functions (for example, making a call, sending a message, or an instant chat). The memory 3103 is mainly configured to store the software program and data. The communication circuit is mainly configured to perform conversion between a baseband signal and a radio-frequency signal and processing of the radio-frequency signal. The communication circuit includes the foregoing phased array. The communication circuit is mainly configured to receive and transmit a radio-frequency signal in a form of an electromagnetic wave. The input/output apparatus, such as a touchscreen, a display, or a keyboard, is mainly configured to receive data inputted by a user and output data to the user.

After the smartphone 310 is powered on, the processor 3102 may read the software program in the memory 3103, interpret and execute instructions of the software program, and process the data of the software program. When data needs to be sent wirelessly, the processor 3102 performs baseband processing on the to-be-sent data, and then outputs a baseband signal to a radio-frequency circuit. The radio-frequency circuit performs radio frequency processing on the baseband signal, and then sends out the radio-frequency signal through the antenna in a form of an electromagnetic wave. When data is sent to the smartphone 310, the radio-frequency circuit receives a radio-frequency signal through the antenna, converts the radio-frequency signal into a baseband signal, and outputs the baseband signal to the processor 3102. The processor 3102 converts the baseband signal into data, and processes the data.

A person skilled in the art may understand that, for ease of description, FIG. 19 shows only one memory and one processor. In an actual terminal device, there may be a plurality of processors and a plurality of memories. The memory may also be referred to as a storage medium, a storage device, or the like. It should be noted that, a type of the memory is not limited in embodiments of this disclosure.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. An apparatus, comprising:
- a local oscillator signal adjustment path comprising:
  - a first input end configured to:
    - couple to a first local oscillator signal source; and
    - receive a first local oscillator signal, wherein the local oscillator signal adjustment path is configured to adjust the first local oscillator signal to generate a first signal; and
  - a first output end configured to send the first signal;
- a first adder comprising:
  - a second input end coupled to the first output end and configured to receive the first signal;
  - a third input end configured to be coupled to a transmit path and configured to receive a second signal, wherein the first adder is configured to superpose the first signal on the second signal to generate a to-be-transmitted signal; and
  - a second output end configured to send the to-be-transmitted signal;
- a first power divider comprising:
  - a fourth input end coupled to the second output end and configured to receive the to-be-transmitted signal, wherein the first power divider is configured to divide the to-be-transmitted signal into a plurality of transmit signals; and
  - a third output end configured to send the plurality of transmit signals; and
- a plurality of radio-frequency signal transmit channels comprising:
  - fifth input ends coupled to the third output ends and configured to receive the plurality of transmit signals from the third output ends, wherein the plurality of radio-frequency signal transmit channels are configured to process the plurality of transmit signals to generate processed transmit signals; and fifth output ends configured to be coupled to a plurality of antennas and configured to transmit, through the plurality of antennas, the processed transmit signals.

2. The apparatus of claim 1, wherein the local oscillator signal adjustment path further comprises a variable gain amplifier configured to perform, on the first local oscillator signal, amplitude adjustment.

3. The apparatus of claim 1, wherein the local oscillator signal adjustment path further comprises a phase shifter configured to perform, on the first local oscillator signal, phase adjustment.

4. The apparatus of claim 1, wherein the local oscillator signal adjustment path further comprises a frequency multiplier configured to perform, on the first local oscillator signal, frequency adjustment.

5. The apparatus of claim 1, further comprising the transmit path, wherein the transmit path comprises:

an intermediate-frequency signal processor comprising a sixth output end; and a first frequency mixer comprising:

a sixth input end coupled to the sixth output end;

a seventh input end configured to be coupled to the first local oscillator signal source; and a seventh output end coupled to the third input end and configured to send the second signal.

6. The apparatus of claim 5, wherein the transmit path further comprises a second frequency mixer comprising:

an eighth input end coupled to the sixth output end;

a ninth input end configured to be coupled to a second local oscillator signal source; and an eighth output end coupled to the sixth input end.

7. The apparatus of claim 5, wherein the transmit path further comprises:

a stray adjustment circuit comprising:

an eighth input end coupled to the first local oscillator signal source and configured to receive the first local oscillator signal;

a ninth input end coupled to the intermediate-frequency signal processor and configured to receive an intermediate-frequency signal; and an eighth output end, wherein the stray adjustment circuit is configured to:

generate, based on the first local oscillator signal and the intermediate-frequency signal, a third signal; and send, through the eighth output end, the third signal; and a second adder comprising:

a tenth input end coupled to the eighth output end and configured to receive the third signal;

an eleventh input end coupled to the seventh output end and configured to receive a fourth signal from the first frequency mixer; and a ninth output end coupled to the second input end, and wherein the second adder is configured to superpose the third signal on the fourth signal to generate the second signal.

8. The apparatus of claim 7, wherein the ninth input end is coupled to the second output end, wherein the eighth output end is coupled to the tenth input end, wherein the seventh output end is coupled to the eleventh input end, wherein the ninth output end is coupled to the third input end, wherein the stray adjustment circuit is further configured to:

generate, based on the first local oscillator signal and a fifth signal from the first adder, a sixth signal; and provide, to the second adder, the sixth signal, and wherein the second adder is configured to superpose the sixth signal on the fourth signal to generate the to-be-transmitted signal.

9. The apparatus of claim 7, wherein the stray adjustment circuit comprises a phase shifter and a second frequency mixer, wherein the second frequency mixer comprises a twelfth input end, a thirteenth input end, and a tenth output end, wherein the phase shifter is coupled between the first local oscillator signal source and the twelfth input end, wherein the thirteenth input end is coupled to the second output end or the sixth output end, and wherein the tenth output end is coupled to the tenth input end.

10. The apparatus of claim 7, wherein the stray adjustment circuit further comprises a phase shifter coupled between the first local oscillator signal source and the seventh input end.

11. The apparatus of claim 7, wherein the stray adjustment circuit further comprises a phase shifter comprising:

a twelfth input end coupled to the sixth output end or the second output end; and a tenth output end configured to be coupled to a thirteenth input end of a second frequency mixer.

12. The apparatus of claim 7, wherein the plurality of radio-frequency signal transmit channels further comprises the stray adjustment circuit and the second adder, wherein the seventh input end is configured to be coupled to a tenth output end of a second power divider, wherein the ninth input end is coupled to the third output end, wherein the eighth output end is coupled to the tenth input end, wherein the seventh output end is coupled to the eleventh input end, wherein the tenth output end is coupled to the third input end, wherein the stray adjustment circuit is further configured to process one of a plurality of local oscillator signals and one of the plurality of transmit signals, and wherein the second adder is configured to superpose a fifth signal from the stray adjustment circuit on the fourth signal.

13. The apparatus of claim 12, wherein the stray adjustment circuit further comprises a first phase shifter and a second frequency mixer, wherein the first phase shifter is coupled between the ninth output end and a twelfth input end of the second frequency mixer, wherein a thirteenth input end of the second frequency mixer is coupled to the third output end, and wherein an eleventh output end of the second frequency mixer is coupled to the tenth input end.

14. The apparatus of claim 13, wherein the stray adjustment circuit further comprises a second phase shifter, and wherein the second phase shifter is coupled between the ninth output end and the seventh input end.

15. The apparatus of claim 1, further comprising the transmit path, wherein the transmit path comprises an intermediate-frequency signal processor, and wherein the intermediate-frequency signal processor comprises a sixth output end coupled to the third input end and configured to send the second signal.

16. The apparatus of claim 15, further comprising a first frequency mixer comprising:

a sixth input end coupled to the second output end; and a seventh output end coupled to the fourth input end.

17. The apparatus of claim 15, further comprising a second power divider comprising an eighth output end configured to:

perform, on a first local oscillator signal, power division to generate a plurality of local oscillator signals; and send, through the eighth output end, the plurality of local oscillator signals, wherein the plurality of radio-frequency signal transmit channels further comprises first frequency mixers comprising:

sixth input ends coupled to the third output end and configured to receive the plurality of transmit signals; and seventh input ends coupled to the eighth output ends and configured to receive the plurality of local oscillator signals, and wherein the first frequency mixers are configured to mix the plurality of local oscillator signals with the plurality of transmit signals.

18. The apparatus of claim 1, wherein the plurality of radio-frequency signal transmit channels further comprises phase shifters configured to perform, on the plurality of transmit signals, phase shifting.

19. An apparatus, comprising:

a circuit board comprising:

one or more processors; and a transceiver coupled to the one or more processors and comprising:

a phased array comprising:

a local oscillator signal adjustment path comprising:

a first input end configured to:

couple to a first local oscillator signal source; and receive a first local oscillator signal, wherein the local oscillator signal adjustment path is configured to adjust the first local oscillator signal to generate a first signal; and a first output end configured to send the first signal;

a first adder comprising:

a second input end coupled to the first output end and configured to receive the first signal;

a third input end configured to be coupled to a transmit path and configured to receive a second signal, wherein the first adder is configured to superpose the first signal on the second signal to generate a to-be-transmitted signal; and a second output end configured to send the to-be-transmitted signal;

a first power divider comprising:

a fourth input end coupled to the second output end and configured to receive the to-be-transmitted signal, wherein the first power divider is configured to divide the to-be-transmitted signal into a plurality of transmit signals; and a third output end configured to send the plurality of transmit signals; and a plurality of radio-frequency signal transmit channels comprising:

fifth input ends coupled to the third output ends and configured to receive the plurality of transmit signals, wherein the plurality of radio-frequency signal transmit channels are configured to process the plurality of transmit signals to generate processed transmit signals; and fifth output ends configured to be coupled to a plurality of antennas and configured to transmit, through the plurality of antennas, the processed transmit signals.

20. An apparatus, comprising:

a local oscillator signal adjustment path comprising a first output end configured to send a first signal;

a transmit path comprising an intermediate-frequency signal processor, wherein the intermediate-frequency signal processor comprises a second output end configured to send a second signal;

a first adder comprising:

a first input end coupled to the first output end and configured to receive the first signal;

a second input end coupled to the second output end and of the transmit path and configured to receive the second signal, wherein the first adder is configured to superpose the first signal on the second signal to generate a to-be-transmitted signal; and a third output end configured to send the to-be-transmitted signal;

a first power divider comprising:

a third input end coupled to the third output end and configured to receive the to-be-transmitted signal, wherein the first power divider is configured to divide the to-be-transmitted signal into a plurality of transmit signals; and fourth output ends configured to send the plurality of transmit signals; and a plurality of radio-frequency signal transmit channels comprising:

fourth input ends coupled to the fourth output ends and configured to receive the plurality of transmit signals from the fourth output ends, wherein the plurality of radio-frequency signal transmit channels are configured to process the plurality of transmit signals to generate processed transmit signals; and fifth output ends configured to be coupled to a plurality of antennas and configured to transmit, through the plurality of antennas, the processed transmit signals.

* * * * *